(12) United States Patent
Qin

(10) Patent No.: US 11,686,794 B2
(45) Date of Patent: Jun. 27, 2023

(54) COIL ASSEMBLY AND CONTROL METHOD THEREOF

(71) Applicant: SHANGHAI UNITED IMAGING HEALTHCARE CO., LTD., Shanghai (CN)

(72) Inventor: Junjun Qin, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 26 days.

(21) Appl. No.: 17/239,782

(22) Filed: Apr. 26, 2021

(65) Prior Publication Data
US 2022/0113362 A1 Apr. 14, 2022

(30) Foreign Application Priority Data

Oct. 9, 2020 (CN) .......................... 202011072792.5
Oct. 9, 2020 (CN) .......................... 202022228553.6

(51) Int. Cl.
*G01R 33/385* (2006.01)
*H01F 27/28* (2006.01)
*H01F 27/06* (2006.01)

(52) U.S. Cl.
CPC ......... *G01R 33/3858* (2013.01); *H01F 27/06* (2013.01); *H01F 27/28* (2013.01)

(58) Field of Classification Search
CPC .......... G01R 33/3858; G01R 33/34046; G01R 33/34084; G01R 33/34007; H01F 27/06; H01F 27/28; H01F 27/303
See application file for complete search history.

(56) References Cited

U.S. PATENT DOCUMENTS

| 5,274,332 | A | * | 12/1993 | Jaskolski | ......... G01R 33/34076 324/318 |
| 6,141,580 | A | * | 10/2000 | Hayashi | ............... G01R 33/341 324/318 |
| 10,048,331 | B2 | | 8/2018 | Harder | |
| D893,725 | S | | 8/2020 | You et al. | |
| 2010/0185198 | A1 | * | 7/2010 | Piferi | ............... G01R 33/34046 606/54 |

(Continued)

FOREIGN PATENT DOCUMENTS

| CN | 202776302 U | 3/2013 |
| CN | 203275624 U | 11/2013 |

(Continued)

OTHER PUBLICATIONS

Shen, han el al., A Manufacture of Locking Mechanism Debugger in the Electro-optical Tracker, Electronic Design Engineering, 19(4): 99-101, 2011.

*Primary Examiner* — Susan S Lee
(74) *Attorney, Agent, or Firm* — Metis IP LLC

(57) ABSTRACT

The present disclosure may provide a coil assmebly configured to transmit or receive a magnetic resonance (MR) signal. The coil assembly may include a coil, a support component, and a lock mechanism. The coil may include a first portion and a second portion detachably connected to the first portion. The support component may be configured to support the coil. The second portion of the coil may be movable with respect to the support component. The lock mechanism may be configured to lock or unlock the second portion of the coil and the support component.

19 Claims, 20 Drawing Sheets

(56) References Cited

U.S. PATENT DOCUMENTS

2011/0040174 A1 2/2011 Driemel
2019/0086490 A1 3/2019 You et al.

FOREIGN PATENT DOCUMENTS

| CN | 106291420 A | 1/2017 | |
|----|----|----|----|
| CN | 107102281 A | 8/2017 | |
| CN | 209932741 U | 1/2020 | |
| CN | 211318721 U | 8/2020 | |
| EP | 749018 A1 * | 12/1996 | ............. A61B 90/17 |
| EP | 3379280 A1 | 9/2018 | |

* cited by examiner

COIL ASSEMBLY AND CONTROL METHOD THEREOF

CROSS-REFERENCE TO RELATED APPLICATIONS

This application claims priority to Chinese Patent Application No. 202011072792.5, filed on Oct. 9, 2020 and Chinese Patent Application No. 202022228553.6, filed on Oct. 9, 2020, the contents of each of which are hereby incorporated by reference in its entirety.

TECHNICAL FIELD

The present disclosure generally relates to a medical imaging system, and more specifically relates to a coil assembly and/or a control method thereof.

BACKGROUND

A Coil (e.g., a joint coil) used in a magnetic resonance imaging (MRI) system is placed on a table to perform an imaging of a region of a subject to be examined. When the coil is used, the position of the coil may need to be adjusted relative to the table, and then the coil be fixed on the table via a lock mechanism, thereby ensuring that the position of the coil stays unchanged and fixed during the imaging of the region. In some cases, such a lock mechanism may be complicated and inconvenient to operate, which affects an operation efficiency. For example, the lock mechanism is controlled by an external switch located on an outer surface of the coil, e.g., a button, a handle, a knob, etc. Thus, it is desirable to design a coil assembly of a simple structure, thereby improving an efficiency of using the coil assembly.

SUMMARY

According to one aspect of the present discourse, a coil assembly may be provided. The coil assembly may be configured to transmit or receive a magnetic resonance (MR) signal. The coil assembly may include: a coil including a first portion and a second portion detachably connected to the first portion; a support component configured to support the coil, the second portion of the coil being movable with respect to the support component; and a lock mechanism configured to lock or unlock the second portion of the coil and the support component. The second portion of the coil may be locked, via the lock mechanism, with the support component when the first portion and the second portion of the coil are in a locked state. The second portion of the coil may be unlocked, via the lock mechanism, from the support component when the first portion and the second portion of the coil are in an unlocked state.

In some embodiments, the lock mechanism may be located on the second portion of the coil. In some embodiments, the lock mechanism may be partially located on the first portion and partially on the second portion of the coil.

In some embodiments, a locking of the first portion and the second portion of the coil may cause a portion of the lock mechanism to move to abut the support component such that the second portion of the coil and the support component are locked. An unlocking of the first portion and the second portion of the coil may cause the portion of the lock mechanism to move away from the support component such that the second portion of the coil and the support component are unlocked.

In some embodiments, a first surface of the first portion of the coil may abut a second surface of the second portion of the coil when the first portion and the second portion of the coil are locked. A portion of the lock mechanism may protrude beyond the second surface of the second portion of the coil such that the portion of the lock mechanism moves relative to the second portion of the coil in response to the locking of the first portion and the second portion of the coil.

In some embodiments, the lock mechanism may include at least one of a pressing component, a transmission component, or a lock component. The pressing component may be connected to the lock component via the transmission component. The pressing component may be configured to move with respect to the second portion of the coil in response to a locking or an unlocking of the first portion and the second portion of the coil. The lock component may be configured to move to lock or unlock, via the transmission component, the second portion of the coil and the support component in response to the movement of the pressing component.

In some embodiments, a first surface of the first portion of the coil may abut a second surface of the second portion of the coil when the first portion and the second portion of the coil are locked. At least a portion of the pressing component may protrude beyond the second surface of the second portion of the coil such that the pressing component moves relative to the second portion of the coil in response to the locking of the first portion and the second portion of the coil.

In some embodiments, the pressing component may be located on the second portion of the coil symmetrically with respect to the second surface of the second portion of the coil.

In some embodiments, the transmission component may be located on the second portion of the coil symmetrically with respect to a third surface of the second portion of the coil different from the second portion of the coil.

In some embodiments, the transmission component may include at least one pully and a string wrapped around the at least one pully. A first end of the string may be connected to the pressing component. A second end of the string may be connected to the lock component. The lock component may be configured to move with the pressing component via the string and the at least one pully.

In some embodiments, the transmission component may include a first rotation component, a second rotation component, and a rod connecting the first rotation component and the second rotation component. A first end of the rod may be connected to the pressing component via the first rotation component. A second end of the rod may be connected to the lock component via the second rotation component. The lock component may be configured to move with the pressing component via the rod, the first rotation component, and the second rotation component.

In some embodiments, the transmission component may include a first rack, a second rack, and a gear meshing with the first rack and the second rack. The first rack may be connected to the pressing component and the gear. The second rack may be connected to the lock component and the gear. The lock component may be configured to move with the pressing component via the gear, the first rack, and the second rack.

In some embodiments, the lock component may include a lock pin, an elastic unit, and a positioning unit. The lock pin may be connected to the transmission component and be connected, via the elastic unit, to the positioning unit. In response to the locking of the first portion and the second portion of the coil, the lock pin may be configured to move to abut the support component to lock the second portion of the coil and the support component. In response to the unlocking of the first portion and the second portion of the coil, the lock pin may be configured to move away from the support component to unlock the second portion of the coil and the support component. The positioning unit may be configured to limit a movement of the elastic unit.

In some embodiments, the lock mechanism may include a reset component located on the second portion of the coil and configured to reset a position of the pressing component. The reset component may include: a positioning unit configured to support the pressing component; and an elastic unit configured to retractably move with respect to the positioning unit. In response to the locking of the first portion and the second portion of the coil, the pressing component may compress the elastic unit such that the pressing component moves along a first direction to cause the locking of the second portion of the coil and the support component. In response to the unlocking of the first portion and the second portion of the coil, the pressing component may move along a second direction that is opposite to the first direction to cause the unlocking of the second portion of the coil and the support component.

In some embodiments, the coil assembly may further include a guiding mechanism configured to guide the second portion of the coil to move along a predetermined direction with respect to the support component. The guiding mechanism may include: a slot located on the support component and a guiding component. A first end of the guiding component may be fixed on the second portion of the coil. A second end of the guiding component may extend into the slot. The guiding component may move along the slot.

In some embodiments, the coil assembly may further include an optical trigger. The optical trigger may be configured to cause the lock mechanism to lock the second portion of the coil and the support component in response to the locking of the first portion and the second portion of the coil. The optical trigger may be configured to cause the lock mechanism to unlock the second portion of the coil and the support component in response to the unlocking of the first portion and the second portion of the coil.

In some embodiments, the optical trigger may include a switch, a first connector, and a second connector. The first connector may be located on the first portion of the coil. The second connector may be located on the second portion of the coil. The switch may be connected to the second connector. In response to the locking of the first portion and the second portion of the coil, the first connector and the second connector may be electrically connected such that the switch causes the lock mechanism to lock the second portion of the coil and the support component.

In some embodiments, the coil assembly may further include an electrical trigger. The electrical trigger may be configured to cause the lock mechanism to lock the second portion of the coil and the support component in response to the locking of the first portion and the second portion of the coil. In some embodiments, the electrical trigger may be configured to cause the lock mechanism to unlock the second portion of the coil and the support component in response to the unlocking of the first portion and the second portion of the coil.

According to another aspect of the present disclosure, a coil assembly may be provided. The coil assembly may include: a support component; a coil comprising a first portion and a second portion, the first portion of the coil being configured to cover the second portion of the coil, and the second portion of the coil being located on and moveable with respect to the support component; and a lock mechanism located on the second portion of the coil. The lock mechanism may be configured to lock or unlock the second portion of the coil and the support component. The lock mechanism may be controlled by locking or unlocking the first portion and the second portion of the coil.

According to another aspect of the present disclosure, a magnetic resonance imaging system may be provided. The magnetic resonance imaging system may include: an imaging device having a magnetic hole; a table; and a coil assembly. The coil assembly may include: a support component; a coil comprising a first portion and a second portion, the first portion of the coil being detachably connected to the second portion of the coil and the second portion of the coil being located on and movable with respect to the support component; and a lock mechanism comprising a pressing component and a lock component. The pressing component may extend beyond the second portion of the coil. The pressing component may be connected to the lock component. The first portion of the coil may abut the pressing component when the first portion and the second portion of the coil are locked. The pressing component may be moveable with respect to the second portion of the coil to cause at least a portion of the lock component to extend out of the second portion of the coil and abut the support component. In some embodiments, the lock mechanism may include a switch. The switch may be controlled, via a sensor trigger or an electrical trigger, to lock the second portion of the coil and the support component after the first portion and the second portion of the coil are locked.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
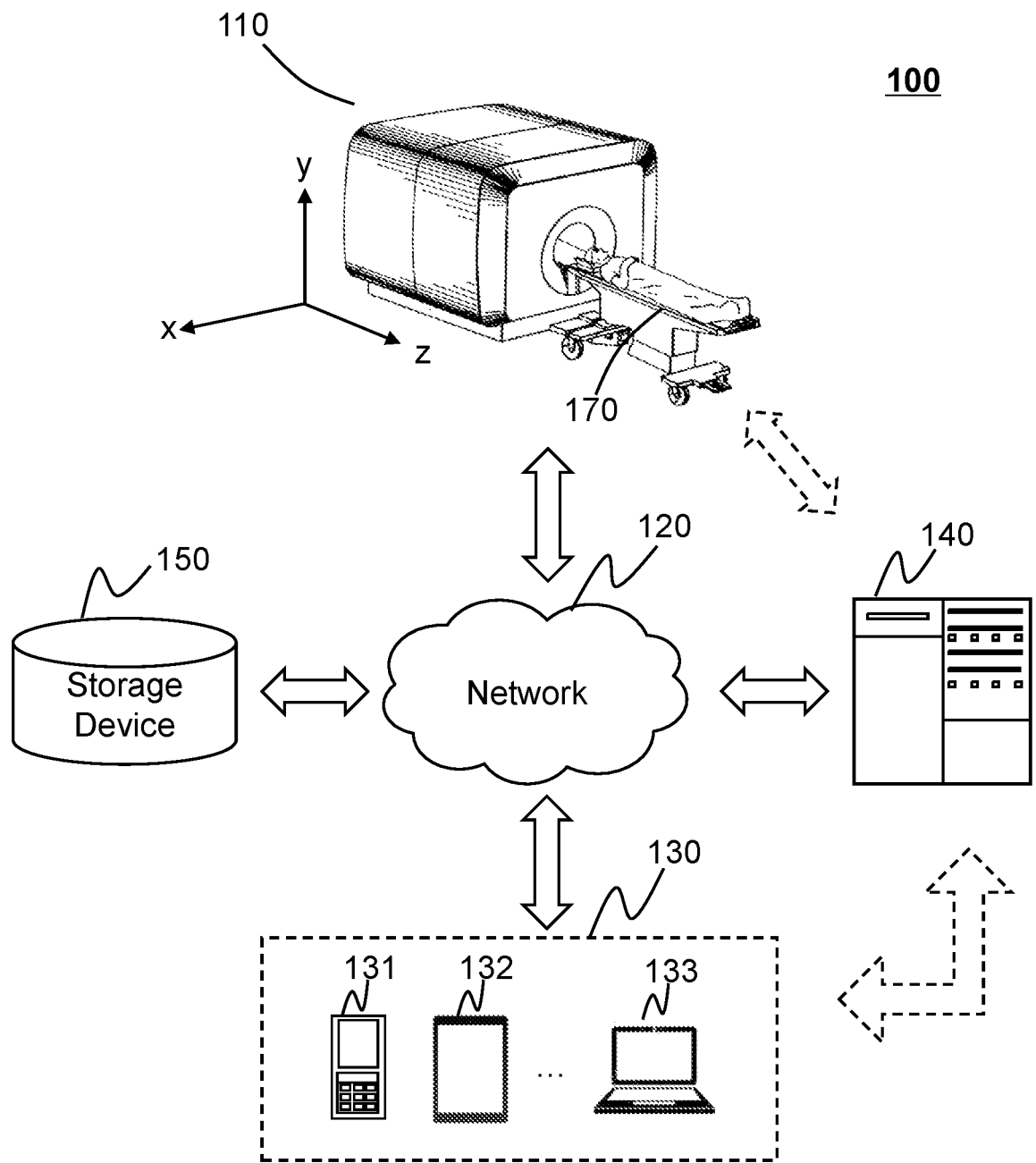
FIG. 1 is a schematic diagram illustrating an exemplary magnetic resonance imaging (MRI) system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is to describe particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, sections or assemblies of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module, or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

It will be further understood that the terms "assembly," "component," "unit," "piece," "hole," etc., when used in this disclosure, refer to one or more parts with one or more specific purposes. However, a structure that may perform a same or similar function compared to a part exemplified above or referred to elsewhere in the present disclosure may be named differently from the present disclosure.

In the present disclosure, spatial reference terms such as "center," "longitudinal," "transverse," "length," "width," "thickness," "upper," "lower," "front," "back," "left," "right," "vertical," "horizontal," "top," "bottom," "inner," "outer," "clockwise," "counterclockwise," "axial," "radial," "circumferential," etc., indicate, in a relative sense, an orientation or positional relationship between two or more elements, assemblies, devices, or systems based on an orientation or positional relationship as shown in the drawings, and are only for the convenience and simplicity of description, rather than indicating or implying that the elements, assemblies, devices or systems in the present disclosure have a particular orientation when the disclosed system, or a portion thereof, is in operation, or are constructed and operated in a particular orientation, and therefore may be not understood as a limitation of the present disclosure.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

In the present disclosure, unless otherwise clearly specified and limited, the terms "mount," "connect," "couple," "fix," etc., should be understood in a broad sense, for example, it may be a fixed connection, a detachable connection, integrated into a whole, a mechanical connection, an electrical connection, directly connected, or indirectly connected via an intermediate medium, an internal connection of two elements, or an interconnection of two elements, unless otherwise clearly defined. For those skilled in the art, the specific meanings of the above terms in the present disclosure may be understood according to specific circumstances.

In the present disclosure, unless expressly stipulated and defined otherwise, a first feature being "above" or "below" the second feature may be that the first feature and the second feature are in direct contact, or the first feature and the second feature may be in indirect contact via an intermediate medium. In some embodiments, the first feature being "above," "on," or "upper" the second feature may mean that the first feature is directly above or obliquely above the second feature, or simply mean that a horizontal height of the first feature is higher than a horizontal height of the second feature. The first feature being "below," "underneath," or "down" the second feature may mean that the first feature is directly below or obliquely below the second feature, or it may simply mean that a horizontal height of the first feature is smaller than a horizontal height of the second feature.

It should be noted that when a first element is referred to as being "fixed to" or "located on" a second element, the first element may be directly on the second element, or an intermediate element may exist. When a first element is described as being "connected to" a second element, the first element may be directly connected to the second element or indirectly via an intermediate element.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The present disclosure relates to a coil assembly for transmitting and/or receiving a magnetic resonance (MR) signal. The coil assembly may include a coil, a support component, and a lock mechanism. The coil may include a first portion (also referred to as a first coil portion) and a second portion (also referred to as a second coil portion) detachably connected to the first coil portion. The support component may be configured to support the coil. The lock mechanism may be configured to lock or unlock the second coil portion and the support component. The second coil portion may be locked with the support component via the lock mechanism by locking the first coil portion and the second coil portion, that is, the coil may be fixed on the support component. The second coil portion may be unlocked from the support component via the lock mechanism by unlocking the first coil portion and the second coil portion. In some embodiments, a region of a subject to be examined may be placed within a cavity of the coil formed by locking the first coil portion and the second coil portion. By fixing the coil on the support component, a position of the region may stay unchanged during an imaging of the region, thereby achieving a desired imaging quality of the region.

In some cases, a current coil assembly may include a current coil and a current support component configured to support the current coil. A locking or an unlocking of a first portion and a second portion of the current coil and a locking or an unlocking of the second portion of the current coil and the current support component may be two independent and separate operations. In some embodiments of the present disclosure, the lock mechanism may be designed to lock or unlock the second coil portion and the support component in response to the locking or unlocking of the first coil portion and the second coil portion. Accordingly, the locking or the unlocking of the second coil portion and the support component may be achieved by the locking or the unlocking of the first coil portion and the second coil portion. That is, in only one operation, the first coil portion and the second coil portion may be locked or unlock, and at the same time, the second coil portion and the support component may be locked or unlocked. In addition, it may be unnecessary to employ an additional switch at an outer surface of the coil assembly to separately lock or unlock the second coil portion and the support component. The structure of the coil assembly may be simplified, and the efficiency for using the coil assembly may be improved.

FIG. 1 is a schematic diagram illustrating an exemplary magnetic resonance imaging (MRI) system according to some embodiments of the present disclosure. As illustrated, the MRI system 100 may include an MRI scanner 110, a network 120, a terminal 130, a processing device 140, and a storage device 150. The components of the MRI system 100 may be connected in one or more of various ways. Merely by way of example, as illustrated in FIG. 1, the MRI scanner 110 may be connected to the processing device 140 through the network 120. As another example, the MRI scanner 110 may be connected to the processing device 140 directly as indicated by the bi-directional arrow in dotted lines linking the MRI scanner 110 and the processing device 140. As a further example, the storage device 150 may be connected to the processing device 140 directly or through the network 120. As still a further example, a terminal device (e.g., 131, 132, 133, etc.) may be connected to the processing device 140 directly (as indicated by the bi-directional arrow in dotted lines linking the terminal 130 and the processing device 140) or through the network 120.

The MRI scanner 110 may scan a subject located within its detection space and generate a plurality of data (e.g., an MR signal, an image) relating to the subject. In the present disclosure, "subject" and "object" are used interchangeably. The subject may include a biological subject (e.g., a human, an animal), a non-biological subject (e.g., a phantom), etc. In some embodiments, the subject may include a specific portion, organ, and/or tissue of the subject. For example, the subject may include head, brain, neck, body, shoulder, arm, thorax, cardiac, stomach, blood vessel, soft tissue, knee, feet, or the like, or any combination thereof. In some embodiments, the MRI scanner 110 may be a closed-bore scanner or an open-bore scanner.

In some embodiments, the MRI scanner 110 may include a table 170. The table 170 may have 6 degrees of freedom, for example, three translational degrees of freedom along three coordinate directions (i.e., the x-direction, the y-direction, and the z-direction) and three rotational degrees of freedom around the three coordinate directions. Accordingly, the table 170 may move the subject along a direction of the 3D coordinate system. Merely by way of example, the table 170 may move the subject into the detection space of the MRI scanner 110 along the z-direction in FIG. 1.

In some embodiments, the x-axis, the y-axis, and the z-axis shown in FIG. 1 may form an orthogonal coordinate system. The x-axis and the z-axis shown in FIG. 1 may be horizontal, and the y-axis may be vertical. As illustrated, the positive x-direction along the x-axis may be from the right side to the left side of the MRI scanner 110 seen from the direction facing the front of the MRI scanner 110; the positive y-direction along the y-axis shown in FIG. 1 may be from the lower part to the upper part of the MRI scanner 110; the positive z-direction along the z-axis shown in FIG. 1 may refer to a direction in which the subject is moved out of the scanning channel (or referred to as the bore) of the MRI scanner 110.

Figure 2:
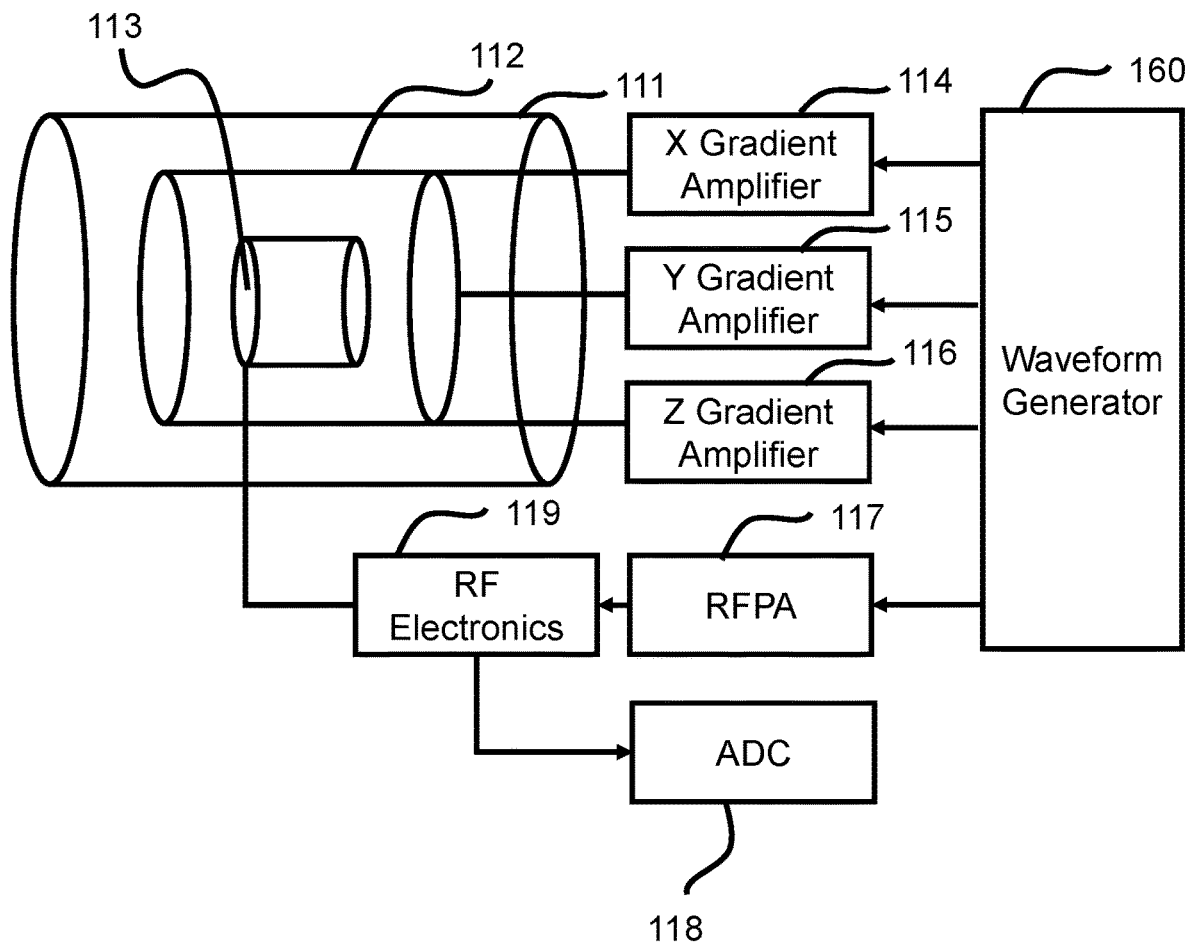
FIG. 2 is a schematic diagram illustrating an exemplary MRI scanner according to some embodiments of the present disclosure.

FIG. 2 is a schematic diagram illustrating an exemplary MRI scanner according to some embodiments of the present disclosure. As illustrated, the magnet 111 may generate a first magnetic field (also referred to as "main magnetic field"). The magnet 111 may include a resistive magnet or a superconductive magnet that both need a power supply (not shown) for operation. Alternatively, the magnet 111 may include a permanent magnet. The magnet 111 may include a bore that the subject is placed within. The magnet 111 may also control the homogeneity of the generated main magnetic field. Some shim coils may be in the magnet 111. The shim coils placed in the gap of the magnet 111 may compensate for the inhomogeneity of the magnetic field of the magnet 111. The shim coils may be energized by a shim power supply.

Gradient coils 112 may be located inside the magnet 111. The gradient coils 112 may generate a second magnetic field (or referred to as a gradient field, including gradient fields Gx, Gy, and Gz). The second magnetic field may be superimposed on the main field generated by the magnet 111 and distort the main field so that the magnetic orientations of the protons of a subject may vary as a function of their positions inside the gradient field, thereby encoding spatial information into MR signals generated by the region of the subject being imaged. The gradient coils 112 may include X coils (e.g., configured to generate the gradient field Gx corresponding to the x-direction), Y coils (e.g., configured to generate the gradient field Gy corresponding to the y-direction), and/or Z coils (e.g., configured to generate the gradient field Gz corresponding to the z-direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 112 may allow spatial encoding of MR signals for image construction. The gradient coils 112 may be connected with one or more of an X gradient amplifier 114, a Y gradient amplifier 115, or a Z gradient amplifier 116. One or more of the three amplifiers may be connected to a waveform generator 160. The waveform generator 160 may generate gradient waveforms that are applied to the X gradient amplifier 114, the Y gradient amplifier 115, and/or the Z gradient amplifier 116. An amplifier may amplify a waveform. An amplified waveform may be applied to one of the coils in the gradient coils 112 to generate a magnetic field in the x-axis, the y-axis, or the z-axis, respectively. The gradient coils 112 may be designed for either a close-bore MRI scanner or an open-bore MRI scanner. In some instances, all three sets of coils of the gradient coils 112 may be energized and three gradient fields may be generated thereby. In some embodiments of the present disclosure, the X coils and Y coils may be energized to generate the gradient fields in the x-direction and the y-direction. As used herein, the x-axis, the y-axis, the z-axis, the x-direction, the y-direction, and the z-direction in the description of FIG. 2 are the same as or similar to those described in FIG. 1.

In some embodiments, radio frequency (RF) coils 113 may be located inside the magnet 111 and serve as transmitters, receivers (also referred to as "receiving coil"), or both. The RF coils 113 may be in connection with RF electronics 119 that may be configured or used as one or more integrated circuits (ICs) functioning as a waveform transmitter and/or a waveform receiver. The RF electronics 119 may be connected to a radiofrequency power amplifier (RFPA) 117 and an analog-to-digital converter (ADC) 118.

When used as transmitters, the RF coils 113 may generate RF signals that provide a third magnetic field that is utilized to generate MR signals related to the region of the subject being imaged. The third magnetic field may be perpendicular to the main magnetic field. The waveform generator 160 may generate an RF pulse. The RF pulse may be amplified by the RFPA 117, processed by the RF electronics 119, and applied to the RF coils 113 to generate the RF signals in response to a powerful current generated by the RF electronics 119 based on the amplified RF pulse.

When used as receivers, the RF coils may be responsible for detecting MR signals (e.g., echoes). After excitation, the MR signals generated by the subject may be sensed by the RF coils 113. The amplifier then may receive the sensed MR signals from the RF coils 113, amplify the sensed MR signals, and provide the amplified MR signals to the ADC 118. The ADC 118 may transform the MR signals from analog signals to digital signals. The digital MR signals then may be sent to the processing device 140 for sampling.

In some embodiments, the gradient coils 112 and the RF coils 113 may be circumferentially positioned with respect to the subject. It is understood by those skilled in the art that the magnet 111, the gradient coils 112, and the RF coils 113 may be situated in a variety of configurations around the subject.

In some embodiments, the RFPA 117 may amplify an RF pulse (e.g., the power of the RF pulse, the voltage of the RF pulse) such that an amplified RF pulse is generated to drive the RF coils 113. The RFPA 117 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 117 may include a linear RFPA, or a nonlinear RFPA. In some embodiments, the RFPA 117 may include one or more RFPAs.

In some embodiments, the MRI scanner 110 may further include a subject positioning system (not shown). The subject positioning system may include a subject cradle and a transport device. The subject may be placed on the subject cradle and be positioned by the transport device within the bore of the magnet 111.

Back to FIG. 1, the network 120 may include any suitable network that can facilitate the exchange of information and/or data for the MRI system 100. In some embodiments, one or more components of the MRI system 100 (e.g., the MRI scanner 110, the terminal 130, the processing device 140, or the storage device 150) may communicate information and/or data with one or more other components of the MRI system 100 via the network 120. For example, the processing device 140 may obtain the received MR signal from the MRI scanner 110 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google™ Glass, an Oculus Rift, a Hololens, a Gear VR, etc. In some embodiments, the terminal 130 may remotely operate the MRI scanner 110 and/or the processing device 140. In some embodiments, the terminal 130 may operate the MRI scanner 110 and/or the processing device 140 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

The processing device 140 may process data and/or information obtained from the MRI scanner 110, the terminal 130, and/or the storage device 150. For example, the processing device 140 may process an MR signal generated by the scanner 110 and encode the MR signal for reconstructing an image. As another example, the processing device 140 may determine a lesion (e.g., a tumor) in the reconstructed image and determine a treatment plan associated with the lesion based on the reconstructed image. In some embodiments, the processing device 140 may be a single server or a server group. The server group may be centralized, or distributed. In some embodiments, the processing device 140 may be local or remote. For example, the processing device 140 may access information and/or data stored in or acquired by the MRI scanner 110, the terminal 130, and/or the storage device 150 via the network 120. As another example, the processing device 140 may be directly connected to the MRI scanner 110 (as illustrated by the bidirectional arrow in dashed lines connecting the processing device 140 and the MRI scanner 110 in FIG. 1), the terminal 130 (as illustrated by the bidirectional arrow in dashed lines connecting the processing device 140 and the terminal 130 in FIG. 1), and/or the storage device 150 to access stored or acquired information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 150 may store data and/or instructions. In some embodiments, the storage device 150 may store data obtained from the MRI scanner 110, the terminal 130 and/or the processing device 140. For example, the processing device 140 may generate a reconstructed image based on received MR signals obtained from the MRI scanner 110, and then the reconstructed image may be stored in the storage device 150 for further use or processing. In some embodiments, the storage device 150 may store data obtained from the terminal 130 and/or the processing device 140. In some embodiments, the storage device 150 may store data and/or instructions that the processing device 140 may execute or use to perform exemplary methods described in the present disclosure. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the MRI system 100 (e.g., the MRI scanner 110, the processing device 140, the terminal 130, etc.). One or more components of the MRI system 100 may access the data or instructions stored in the storage device 150 via the network 120. In some embodiments, the storage device 150 may be directly connected to or communicate with one or more components of the MRI system 100 (e.g., the MRI scanner 110, the processing device 140, the terminal 130, etc.). In some embodiments, the storage device 150 may be part of the processing device 140.

In some embodiments, the MRI system 100 may further include one or more power supplies (not shown in FIG. 1) connected to one or more components of the MRI system 100 (e.g., the MRI scanner 110, the processing device 140, the terminal 130, the storage device 150, etc.).

This description is intended to be illustrative, and not to limit the scope of the present disclosure. Many alternatives, modifications, and variations may be apparent to those skilled in the art. The features, structures, methods, and characteristics of the exemplary embodiments described herein may be combined in various ways to obtain additional and/or alternative exemplary embodiments. However, those variations and modifications do not depart the scope of the present disclosure.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guided radiotherapy (IGRT), etc. The image-guided radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

For illustration purposes, the disclosure describes systems and methods for MRI medical applications (e.g., MRI imaging, MRI guided radiotherapy treatment, etc.). It should be noted that the MRI system 100 described below is merely provided for illustration purposes, and not intended to limit the scope of the present disclosure.

In some embodiments of the present disclosure, a coil assembly may be provided. The coil assembly may be used in an MRI system (e.g., the MRI system 100). The coil assembly may be used to image a region of a subject to be examined. Image information (e.g., an imaging dataset, an image) of the region may be acquired. It should be noted that the region may be a region including a lesion, a region excluding a lesion, etc. In some embodiments, the coil assembly may be used as a joint coil, a head coil, a limb coil, a wrist coil, or the like, or any combination thereof. Merely by way of example, the joint coil may include a knee joint coil, an ankle joint coil, a shoulder joint coil, a wrist joint coil, etc. In some embodiments, the coil assembly may be served as a transmitter (also referred to as a transmitting coil), a receiver (also referred to as a receiving coil), or a combination thereof. In some embodiments, the coil assembly may be movable with respect to a table (e.g., the table 170 in FIG. 1) to adjust a position of the coil assembly with respect to the table to satisfy use demands of different situations. In some embodiments, a shape and/or a structure of the coil assembly may be designed according to a specific shape of the region of the subject to be examined. For illustration purposes, some embodiments of the present disclosure may take the coil assembly being a joint coil as an example.

In some embodiments, to ensure an imaging effect of the coil assembly, the coil assembly may need to be fixed. In some current cases, the coil assembly may be fixed by a current lock mechanism. The current lock mechanism may be controlled by an external switch, for example, a button, a handle, a knob, etc. A structure of the current lock mechanism may be complicated and inconvenient to operate, which affects the operation efficiency and is inconvenient to use. To solve the problems, the present disclosure may provide a coil assembly with a simple structure that is easy to operate. The coil assembly can be reliably locked, ensuring the working reliability of the coil assembly. Besides, the adjustment (e.g., a position adjustment) of the coil assembly may be convenient, thereby being ease of use. More descriptions of the structure of the coil assembly may be described below.

In some embodiments, the coil assembly may include a coil (e.g., the RF coil 113 in FIG. 1), a support component, and a lock mechanism. The coil may include a first portion (also referred to as a first coil portion) and a second portion (also referred to as a second coil portion) detachably connected to the first coil portion. The support component may be configured to support the coil. The lock mechanism may be configured to lock or unlock the second coil portion and the support component. In some embodiments, the lock mechanism may be located on the second coil portion (e.g., as shown in FIGS. 3-19). In some embodiments, the lock mechanism may be partially located on the first coil portion and partially on the second coil portion.

In some embodiments, the second coil portion may be locked with the support component via the lock mechanism when the first coil portion and the second coil portion are in a locked state. The second coil portion may be locked with the support component via the lock mechanism by locking the first coil portion and the second coil portion. The second coil portion may be unlocked from the support component via the lock mechanism when the first coil portion and the second coil portion are in an unlocked state. The second coil portion may be unlocked from the support component via the lock mechanism by unlocking the first coil portion and the second coil portion. In some embodiments, the locking of the first coil portion and the second coil portion may cause a portion (e.g., a lock component or a portion thereof) of the lock mechanism to move to abut the support component such that the second coil portion and the support component are locked. The unlocking of the first coil portion and the second coil portion may cause the portion of the lock mechanism to move away from the support component such that the second coil portion and the support component may be unlocked.

In some embodiments, a first surface (e.g., a lower surface) of the first coil portion may abut a second surface (e.g., an upper surface) of the second coil portion when the first coil portion and the second coil portion are locked. A portion of the lock mechanism (e.g., one or more pressing components or a portion thereof) may protrude beyond the second surface of the second coil portion such that the portion of the lock mechanism may move relative to the second coil portion in response to the locking of the first coil portion and the second coil portion. For example, in response to the locking of the first coil portion and the second coil portion, the portion of the lock mechanism may be pressed down.

In some embodiments, the lock mechanism may include a mechanical trigger. At least a portion of the lock mechanism (e.g., one or more pressing components or a portion thereof) may extend beyond the second coil portion, and contact with the first coil portion when the first coil portion and the second coil portion are locked. The second coil portion and the support component may be locked via the lock mechanism by the first coil portion contacting with and/or abutting the lock mechanism.

In some embodiments, the lock mechanism may include a pressing component, a transmission component, or a lock component, etc. The pressing component may be connected to the lock component via the transmission component, that is, the transmission component may be connected to the pressing component and the lock component. The pressing component may be configured to move with respect to the second coil portion in response to the locking or unlocking of the first coil portion and the second coil portion. In some embodiments, the lock component may be configured to lock or unlock the second coil portion and the support component. The lock component may be configured to move to lock or unlock, via the transmission component, the second coil portion and the support component in response to the movement of the pressing component.

In some embodiments, the pressing component may extend beyond the second coil portion. The pressing component may abut the first coil portion in response to the locking of the first coil portion and the second coil portion. For example, a first surface (e.g., the lower surface) of the first coil portion may abut a second surface (e.g., the upper surface) of the second coil portion when the first coil portion and the second coil portion are locked. At least a portion of the pressing component may protrude beyond the second surface of the second coil portion such that the pressing component may move relative to the second coil portion in response to the locking of the first coil portion and the second coil portion.

In some embodiments, the pressing component may be pressable. For example, the pressing component may be a pressable button. The pressing component may be partially located inside the second coil portion and partially extend beyond the second surface of the second coil portion. A lower side of the pressing component may be connected to a first end of the transmission component. A second end of the transmission component may be connected to the lock component. The transmission component may implement a movement transmission of the pressing component to control the lock component to generate a corresponding movement.

In some embodiments, when the first coil portion is locked with the second coil portion, the first surface of the first coil portion may abut the pressing component. The pressing component may be pressed downward. The pressing component may cause the transmission component to move, such that the transmission component may cause the lock component to move. At this time, at least a portion of the lock component may extend out of the second coil portion and contact with the support component to lock the second coil portion and the support component. When the first coil portion is separated from the second coil portion, an upper side of the pressing component may be no longer pressed. The pressing component may extend beyond the second coil portion, and the transmission component and the lock component may move together. The lock component may move out of the support component and retract into the second coil portion, unlocking the second coil portion and the support component. More descriptions of the pressing component may be found elsewhere in the present disclosure. See, e.g., FIG. 4 and FIG. 5.

In some embodiments, the transmission component may include at least one pully and a string wrapped around the at least one pully. A first end of the string may be connected to the pressing component. A second end of the string may be connected to the lock component. The lock component may be configured to move with the pressing component via the string and the at least one pully. In some embodiments, a count of the at least one pully of the transmission component may be non-limiting, e.g., one, two, three, four, or more. More descriptions of the transmission component including the at least one pully and the string may be found elsewhere in the present disclosure. See, e.g., FIGS. 6-8, or the descriptions thereof.

In some embodiments, the transmission component may include two rotation components (e.g., a first rotation component, a second rotation component) and a rod connecting the first rotation component and the second rotation component. A first end of the rod may be connected to the pressing component via the first rotation component. A second end of the rod may be connected to the lock component via the second rotation component. The lock component may be configured to move with the pressing component via the rod, the first rotation component, and the second rotation component. In some embodiments, a count of the rotation component of the transmission component may be non-limiting, e.g., one, two, three, four, or more. More descriptions of the transmission component including the first rotation component, the second rotation component, and the rod may be found elsewhere in the present disclosure. See, e.g., FIGS. 9-11, or the descriptions thereof.

In some embodiments, the transmission component may include two racks (e.g., a first rack, a second rack) and a gear meshing with the first rack and the second rack. The first rack may be connected to the pressing component and the gear. The second rack may be connected to the lock component and the gear. The lock component may be configured to move with the pressing component via the gear, the first rack, and the second rack. In some embodiments, a count of the rack of the transmission component may be non-limiting, e.g., one, two, three, four, or more. More descriptions of the transmission component including the first rack, the second rack, and the gear may be found elsewhere in the present disclosure. See, e.g., FIG. 12 and FIG. 13, or the descriptions thereof.

In some embodiments, the lock component may include a lock pin, an elastic unit, and a positioning unit. The lock pin may be connected to the transmission component and connected, via the elastic unit, to the positioning unit. In response to the locking of the first coil portion and the second coil portion, the lock pin may be configured to move to abut the support component to lock the second coil portion and the support component. In response to the unlocking of the first coil portion and the second coil portion, the lock pin may be configured to move away from the support component to unlock the second coil portion and the support component. The positioning unit may be configured to limit a movement of the elastic unit. More descriptions of the lock component may be found elsewhere in the present disclosure. See, e.g., FIG. 3, 6-8, 9-14, or the descriptions thereof.

It should be noted that the above descriptions may be for illustration purposes and non-limiting. A count of the pressing component or the transmission component included in the lock mechanism may be non-limiting. For example, the count of the pressing component included in the lock mechanism may be one, two, three, four, or more. As another example, the count of the transmission component included in the lock mechanism may include one, two, three, four, or more.

Figure 4:
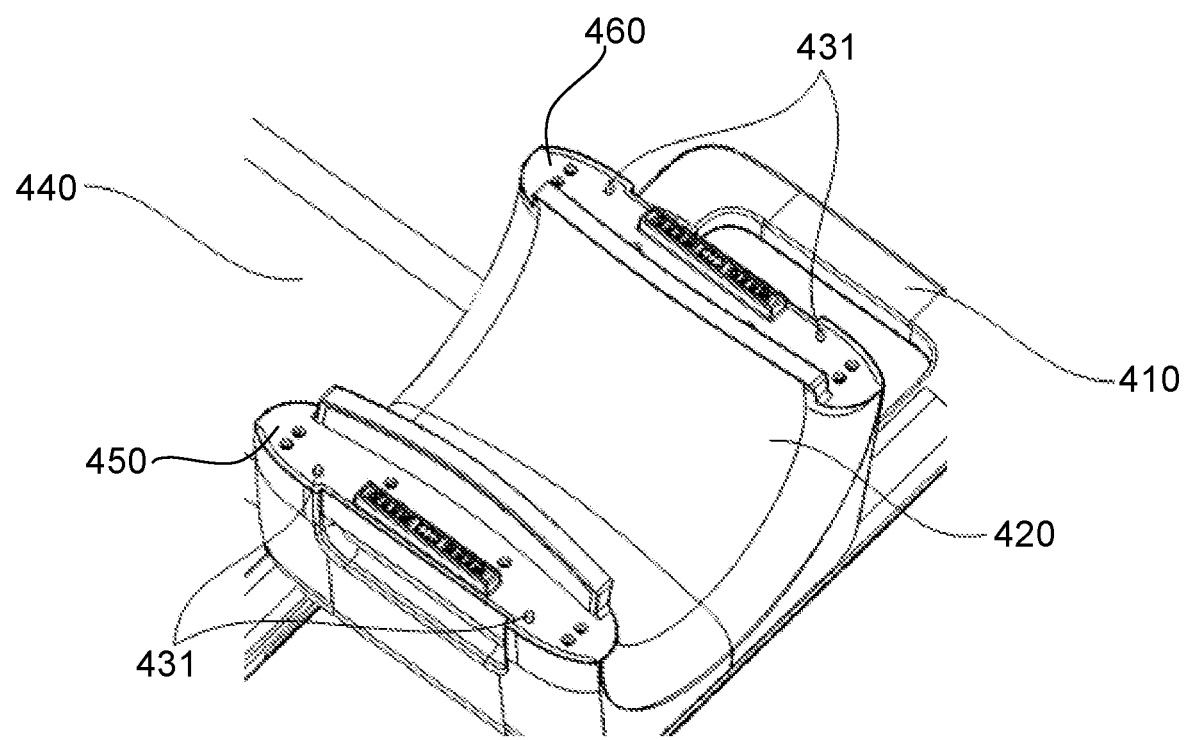
FIG. 4 is a schematic diagram of exemplary pressing components of a lock mechanism on a second coil portion of a coil assembly according to some embodiments of the present disclosure.
Figure 5:
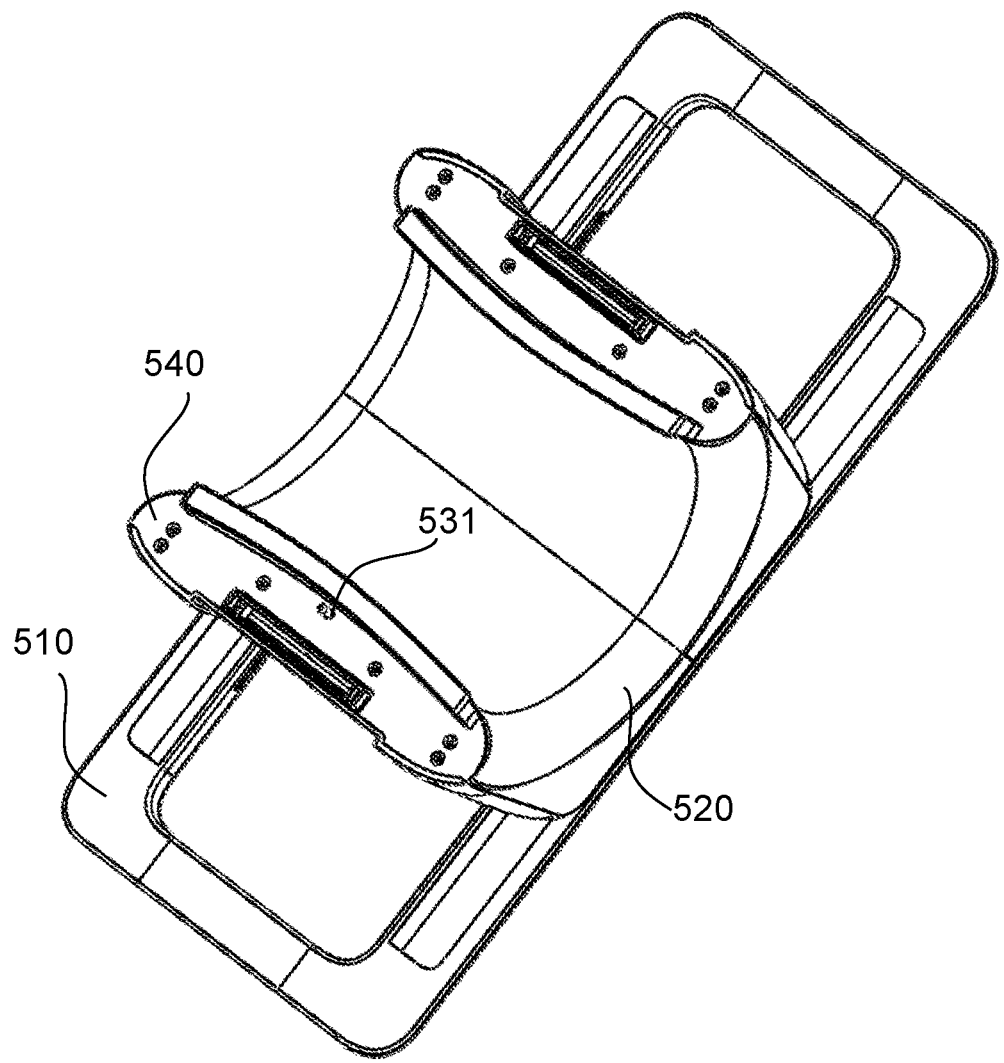
FIG. 5 is a schematic diagram of an exemplary pressing component of a lock mechanism on a second coil portion of a coil assembly according to some embodiments of the present disclosure.

In some embodiments, the lock mechanism may include one pressing component. The pressing component may be located at a center of a side of the second coil portion (e.g., as shown in FIG. 5). In some embodiments, the lock mechanism may include more than one pressing component. The more than one pressing component (e.g., four) may be located on the second coil portion symmetrically with respect to the second surface of the second coil portion (e.g., as shown in FIG. 4).

Figure 6:
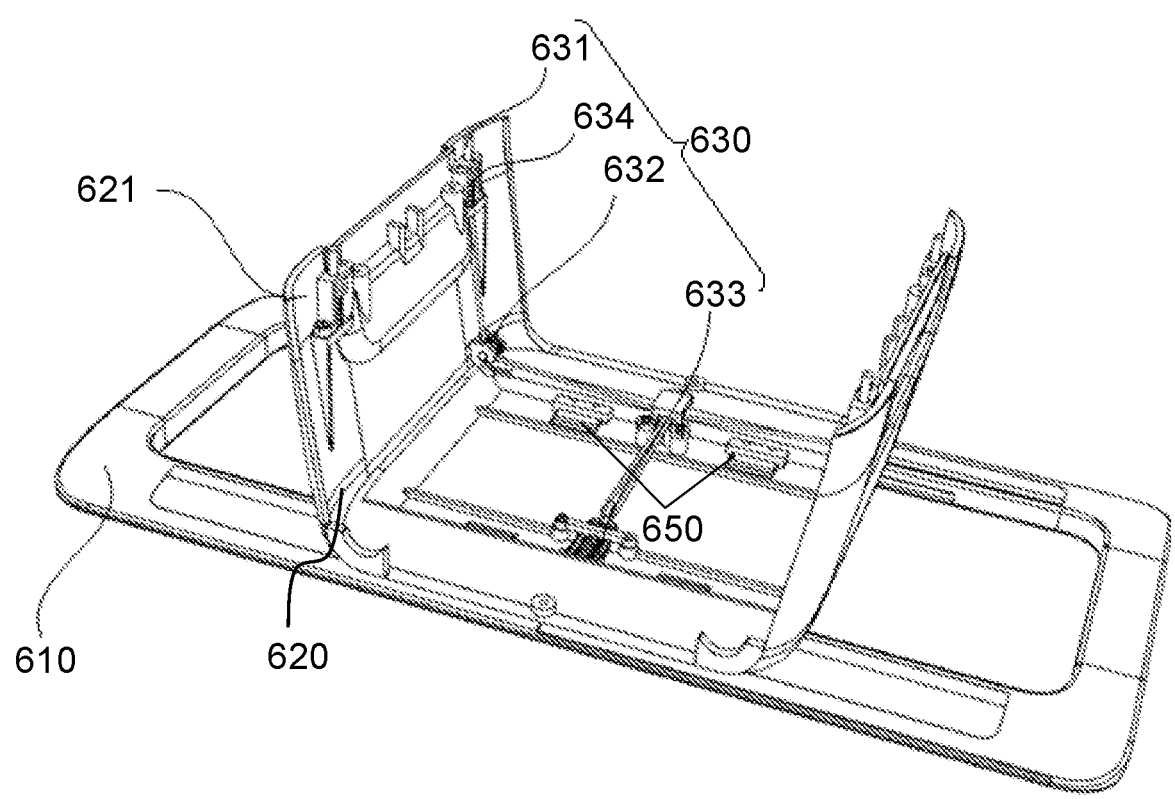
FIG. 6 is a schematic diagram of an exemplary lock mechanism on a second coil portion of a coil assembly according to some embodiments of the present disclosure.
Figure 7:
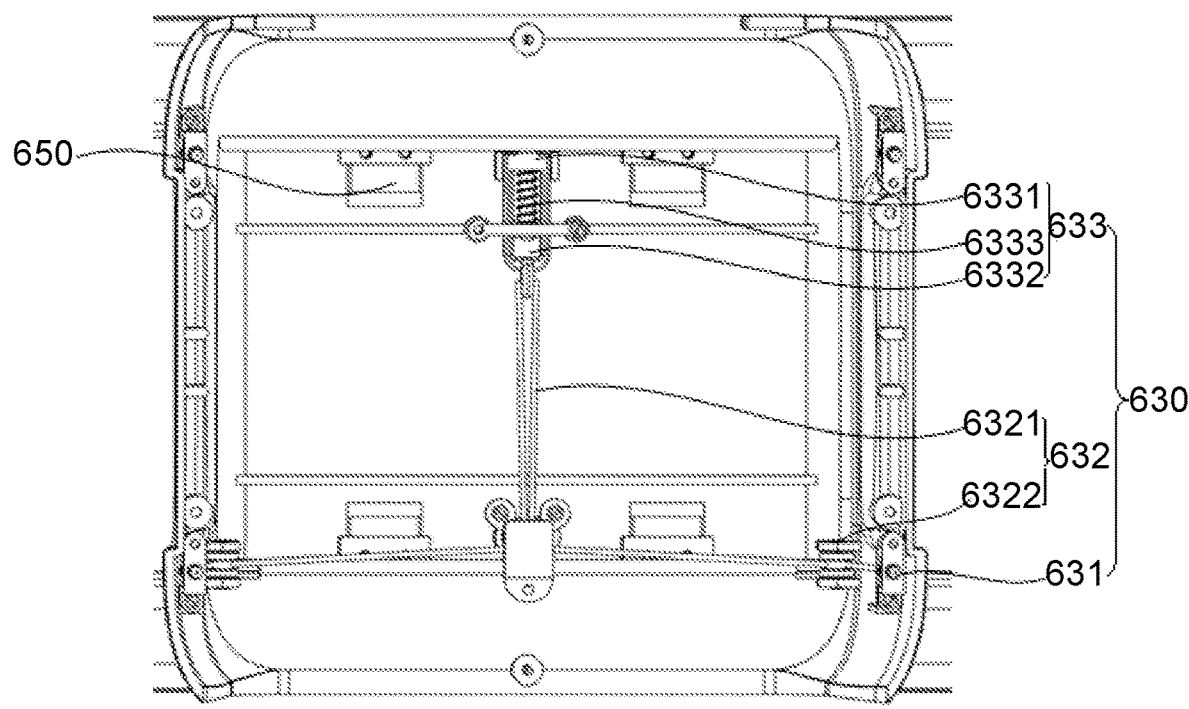
FIG. 7 is a top view of an exemplary lock mechanism on a second coil portion of a coil assembly according to some embodiments of the present disclosure.

In some embodiments, the lock mechanism may include more than one transmission component (e.g., two). The more than one transmission component may be located on the second coil portion symmetrically with respect to a third surface (e.g., a bottom surface) of the second coil portion different from the second coil portion (e.g., as shown in FIG. 6 and FIG. 7).

In some embodiments, the count of the pressing component and the count of the transmission component may be the same, and each pressing component may be connected to a corresponding transmission component. For example, the lock mechanism may include two pressing components and two transmission components connected to the two pressing components. As another example, the lock mechanism may include four pressing components and four transmission components connected to the four pressing components.

In some embodiments, the count of the pressing component and the count of the transmission component may be different. For example, the coil assembly may include four pressing components and two transmission components connected to two of the four pressing components, respectively. As another example, the coil assembly may include two pressing components and four transmission components. Each of the two pressing components may be connected to two of the four transmission components.

In some embodiments, the lock mechanism may also include a reset component located on the second coil portion. The reset component may be configured to reset a position of the pressing component. The reset component may include a positioning unit and an elastic unit. The positioning unit may be configured to support the pressing component. The elastic unit may be configured to retractably move with respect to the positioning unit. In response to the locking of the first coil portion and the second coil portion, the pressing component may compress the elastic unit such that the pressing component may move along a first direction to cause the locking of the second coil portion and the support component. In response to the unlocking of the first coil portion and the second coil portion, the pressing component may move along a second direction that is opposite to the first direction to cause the unlocking of the second coil portion and the support component.

In some embodiments, a count of the reset component of the lock mechanism may include, one, two, three, four, or more. In some embodiments, the count of the reset component may be the same as the count of the pressing component of the lock mechanism. More descriptions of the reset component may be found elsewhere in the present disclosure. See, e.g., FIG. 8 or the descriptions thereof.

In some embodiments, the coil assembly may also include a guiding mechanism. The guiding mechanism may be configured to guide the second coil portion to move along a predetermined direction (e.g., a length direction of the support component) with respect to the support component. In some embodiments, the guiding mechanism may include a slot and a guiding component. The slot may be located on the support component. A first end of the guiding component may be fixed on the second coil portion. A second end of the guiding component may extend into the slot. The guiding component may move along the slot. In some embodiments, a cross-section of the guiding component may include a U shape. A cross-section of the slot may include a U-shape. More descriptions of the guiding mechanism may be found elsewhere in the present disclosure. See, e.g., FIGS. 6-8 and 15-19, or the descriptions thereof.

It should be noted that the above descriptions are for illustration purposes and non-limiting. The guiding mechanism and/or the support component may include other types of structures that are capable of a linear movement. In some embodiments, the guiding mechanism may include a sliding rail and a sliding block matched with the sliding rail. For example, the guiding mechanism may include the sliding rail and the support component may include the sliding block. As another example, the guiding mechanism may include the sliding block and the support component may include the sliding rail.

In some embodiments, the coil assembly may include a second lock mechanism configured to lock or unlock the first coil portion and the second coil portion. For example, the second lock mechanism may include a fastener, a spring, etc.

In some embodiments, the support component may be connected to (e.g., fixed on) a table (e.g., the table 170) of the MRI system. The second coil portion may be movable with respect to the support component, that is, the second coil portion may be movable with respect to the table. For example, when the first coil portion and the second coil portion are unlocked, the second coil portion may be movable with respect to the support component.

In some embodiments, the coil assembly (e.g., the lock mechanism thereof) may include an optical trigger. The optical trigger may be configured to cause the lock mechanism to lock the second coil portion and the support component in response to the locking of the first coil portion and the second coil portion. The optical trigger may be configured to cause the lock mechanism to unlock the second coil portion and the support component in response to the unlocking of the first coil portion and the second coil portion.

In some embodiments, the optical trigger may include a switch, a first connector, and a second connector. The first connector may be located on the first coil portion. The second connector may be located on the second coil portion. The switch may be connected to the second connector. In response to the locking of the first coil portion and the second coil portion, the first connector and the second connector may be electrically connected such that the switch may cause the lock mechanism to lock the second coil portion and the support component.

In some embodiments, the coil assembly (e.g., the lock mechanism thereof) may include an electrical trigger. The lock mechanism may include a switch, a first connector, and a second connector. The first connector may be located on the first coil portion. The second connector may be located on the second coil portion. The switch may be electrically connected to the second connector. The switch may be configured to lock or unlock the second coil portion and the support component. In some embodiments, in response to the locking of the first coil portion and the second coil portion, the first connector and the second connector may be electrically connected such that the switch locks the second coil portion and the support component.

In some embodiments, the switch may be controlled to lock or unlock the second coil portion and the support component by electrically connecting or not connecting the first connector and the second connector via a current or a signal. When the first connector and the second connector are electrically connected, the switch may be triggered to lock the second coil portion and the support component. When the first connector and the second connector are not electrically connected, the switch may be not triggered, and correspondingly the switch may be unable to lock the second coil portion and the support component. At this time, the second coil portion and the support component may be unlocked.

In some embodiments, when the first coil portion is locked with the second coil portion, the first connector and the second connector may be electrically connected. When the first coil portion is separated from the second coil portion, the first connector and the second connector may be not electrically connected. In some embodiments, the first connector and the second connector may establish an electrical connection, a signal transmission connection, etc.

In some embodiments, similar to the optical trigger, the electrical trigger may be configured to cause the lock mechanism to lock the second coil portion and the support component in response to the locking of the first coil portion and the second coil portion. The electrical trigger may be configured to cause the lock mechanism to unlock the second coil portion and the support component in response to the unlocking of the first coil portion and the second coil portion. In some embodiments, the lock mechanism may control the locking or unlocking of the second coil portion and the support component through an electrical connection or a signal transmission.

In some embodiments, the lock mechanism may include a sensor trigger. The lock mechanism may include a sensor and a switch. For example, the sensor may include a gravity sensor, a pressure sensor, etc. The sensor may detect a pressure of a surface (e.g., the upper surface) of the second coil portion and generate a corresponding signal. In some embodiments, the sensor may be electrically connected to the switch. The corresponding signal generated by the sensor may be received by the switch. The switch may be triggered to lock the second coil portion and the support component.

In some embodiments, the second coil portion may include a first concave. The first coil portion may include a second concave. An upper side of the second coil portion may be provided with a pressure sensor. When the second coil portion is not locked with the first coil portion, the pressure sensor may fail to detect a pressure signal. The switch may not work, and the second coil portion and the support component may be in an unlocked state. The second coil portion may be movable relative to the support component under an external force. When the first coil portion is locked with the second coil portion, the first concave and the second concave may cooperate to form a detection cavity through which a subject to be examined passes. At the same time, the pressure sensor may detect the pressure signal. The switch may receive the pressure signal from the pressure sensor and switch from the non-operating state to an operating state. The second coil portion and the support component may be in a locked state. More descriptions of the electrical trigger, the optical trigger, and/or the sensor trigger may be found elsewhere in the present disclosure. See. e.g., FIG. 20, or the descriptions thereof.

Figure 3:
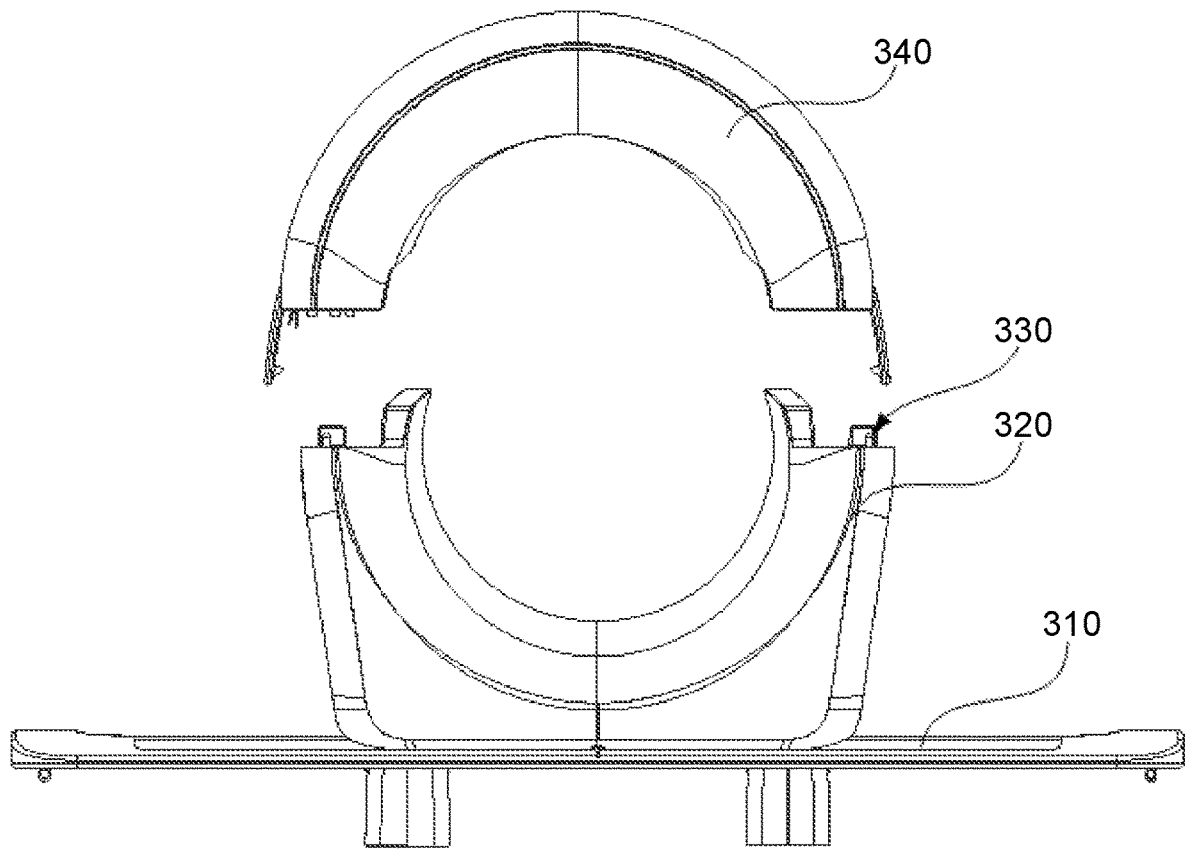
FIG. 3 is a schematic diagram of an exemplary coil assembly according to some embodiments of the present disclosure.

FIG. 3 is a schematic diagram of an exemplary coil assembly according to some embodiments of the present disclosure.

As shown in FIG. 3, a coil assembly 300 may include a support component 310, a second coil portion 320, a lock mechanism 330, and a first coil portion 340. The first coil portion 340 may be configured to cover the second coil portion 320 when the first coil portion 340 is locked with the second coil portion 320. The second coil portion 320 may be movably located on the support component 310. The lock mechanism 330 may be located on the second coil portion 320. The lock mechanism 330 may be configured to lock or unlock the second coil portion 320 and the support component 310. The lock mechanism 330 may be controlled by a locking or an unlocking of the first coil portion 340 and the second coil portion 320.

In some embodiments, the support component 310 may have a support function, for example, the support component 310 may support at least one component (e.g., the second coil portion 320, the lock mechanism 330, the first coil portion 340) of the coil assembly 300. The coil assembly 300 may be mounted on a table of an MRI system (e.g., the table 170 of the MRI system 100) via the support component 310. In some embodiments, a position of the coil assembly 300 with respect to the table may be adjustable by moving the second coil portion 320 with respect to the support component 310. In some embodiments, the support component 310 may be fixed on the table. For example, the support component 310 may be fixed on the table by a fixing component, e.g., a screw, a converter, an adaptor ring, a bolt, a nut, a gasket, an airtight glue, an airtight adhesive tape, or the like, or any combination thereof.

In some embodiments, the first coil portion 340 and the second coil portion 320 may be detachably connected. When the coil assembly 300 is used, e.g., for imaging, the first coil portion 340 and the second coil portion 320 may be locked to form a complete coil body (also referred to as the coil) (e.g., the RF coil 113). The first coil portion 340 and the second coil portion 320 may cooperate with each other to emit a local radio frequency (RF) field (e.g., the third magnetic field in FIG. 1) to a region of a subject to be examined, or receive an MR signal generated by proton nuclear spin of the region. After the use of the coil assembly is completed, the first coil portion 340 may be unlocked, that is, the first coil portion 340 may be separated from the second coil portion 320, thereby disassembling the first coil portion 340 and the second coil portion 320.

In some embodiments, the second coil portion 320 may be movably located on the support component 310, that is, a position of the second coil portion 320 on the support component 310 may be adjustable. A position of the second coil portion 320 on the table may be adjustable such that the second coil portion 320 may be circumferentially positioned with respect to the region to be examined. In some embodiments, the second coil portion 320 may include the lock mechanism 330. The second coil portion 320 and the support component 310 may be locked or unlocked via the lock mechanism 330. When the second coil portion 320 and the support component 310 are locked via the lock mechanism 330, the second coil portion 320 may be unable to move with respect to the support component 310. The position of the second coil portion 320 may be fixed and not adjustable. When the second coil portion 320 and the support component 310 are unlocked via the lock mechanism 330, the second coil portion 320 may be movable with respect to the support component 310. The second coil portion 320 may be at a free state, and the position of the second coil portion 320 with respect to the support component may be adjustable to a target position. When the first coil portion 340 and the second coil portion 320 are fixed at the target position, the coil may cover a target region within which the region to be examined may be placed.

In some embodiments, when the coil assembly 300 needs to be used, a deviation between a current position of the second coil portion 320 and the target position may exist after the support component 310 is placed on the table. In such cases, the position of the second coil portion 320 may need to be adjusted. The lock mechanism 330 may be controlled to be unlocked to move the second coil portion 320 on the support component 310 such that the second coil portion 320 may move to the target position. After the second coil portion 320 is at the target position, the first coil portion 340 may be locked with the second coil portion 320. The lock mechanism 330 may be controlled to be locked to fix the second coil portion 320 on the support component 310, thereby preventing a movement of the second coil portion 320. At this time, a coil body (also referred to as the coil) formed by the first coil portion 340 and the second coil portion 320 may cover the target region. The region to be examined may be placed within the target region, and an imaging of the region to be examined may be performed.

In some embodiments, the lock mechanism 330 may be located on the second coil portion 320. The lock mechanism 330 may be retractably movable on the second coil portion 320. When a portion of the lock mechanism 330 extends out of the second coil portion 320, an end of the lock mechanism 330 may abut the support component 310 to lock the second coil portion 320 and the support component 310. When the portion of the lock mechanism 330 retracts into the second coil portion 320, the end of the lock mechanism 330 may be separated from the support component 310. The second coil portion 320 and the support component 310 may be unlocked. In some embodiments, the locking or unlocking of the second coil portion 320 and the support component 310 via the lock mechanism 330 may be controlled by locking or unlocking the first coil portion 340 and the second coil portion 320. When the first coil portion 340 is locked with the second coil portion 320, the first coil portion 340 may trigger the lock mechanism 330 on the second coil portion 320 to lock the second coil portion 320 and the support component 310. After the first coil portion 340 is locked with the second coil portion 320, the first coil portion 340 may trigger the lock mechanism on the second coil portion 320 to lock the second coil portion 320 and the support component 310. When the first coil portion 340 is unlocked from the second coil portion 320, that is, the first coil portion 340 is separated from the second coil portion 320, the first coil portion 340 may not trigger the lock mechanism 330. The support component 310 and the second coil portion 320 may be unlocked via the lock mechanism 330.

As described above, when the second coil portion 320 and the first coil portion 340 are locked, the first coil portion 340 may cause the lock mechanism 330 to lock the second coil portion 320 and the support component 310. When the first coil portion 340 is separated from the second coil portion 320, the first coil portion 340 may be separated from the lock mechanism 330 to unlock the second coil portion 320 and the support component 310. The lock mechanism 330 may be controlled by the locking or unlocking of the first coil portion 340 and the second coil portion 320 such that the lock mechanism 330 may lock or unlock the second coil portion 320 and the support component 310. A structure of the lock mechanism 330 may be less complicated than that of a conventional lock mechanism, which may effectively solve the problem of an inconvenient operation caused by a complicated structure of the conventional lock mechanism.

FIG. 4 is a schematic diagram of exemplary pressing components of a lock mechanism on a second coil portion of a coil assembly according to some embodiments of the present disclosure.

In some embodiments, a coil assembly 400 may include a support component 410, a lock mechanism, and a coil. The coil may include a first coil portion (not shown in FIG. 4) and a second coil portion 420. The lock mechanism may include four pressing components 431, at least one transmission component, and at least one lock component (not shown in FIG. 4). In some embodiments, the coil assembly 400 may be movably mounted on a table 440 (e.g., the table 170 of the MRI system 100).

As shown in FIG. 4, the four pressing components 431 may be located on a surface (e.g., an upper surface) of the second coil portion 420 that abuts the first coil portion when the first coil portion and the second coil portion 420 are locked. The four pressing components 431 may be symmetrical with respect to the surface of the second coil portion 420.

As shown in FIG. 4, a first side 450 of the surface of the second coil portion 420 may include two of the four pressing components 431 symmetrical with respect to the first side 450. A second side 460 of the surface of the second coil portion 420 may include the remaining two of the four pressing components 431 symmetrical with respect to the second side 460. In some embodiments, the first side 450 and the second side 460 may be symmetrical with respect to the surface of the second coil portion 420.

FIG. 5 is a schematic diagram of an exemplary pressing component of a lock mechanism on a second coil portion of a coil assembly according to some embodiments of the present disclosure.

In some embodiments, a coil assembly 500 may include a support component 510, a lock mechanism, and a coil. The coil may include a first coil portion (not shown in FIG. 5) and a second coil portion 520. The lock mechanism may include one pressing component 531, at least one transmission component, and at least one lock component. As shown in FIG. 5, the pressing component 531 may be located on a surface (e.g., an upper surface) of the second coil portion 520 that abuts the first coil portion when the first coil portion and the second coil portion are locked. The pressing component 531 may be located at a center of a side 540 of the surface of the second coil portion 2020.

It should be noted that a structure of the pressing component 431 or 531 may be the same as or similar to other pressing components (e.g., the pressing component in FIG. 1, the pressing component 631, 931, 1231, or 1531) described in the present disclosure. It should also be noted that components of the coil assembly 400 or 500 other than the pressing component 431 or 531 may be similar to or the same as other coil assemblies described in the present disclosure (e.g., the coil assembly in FIG. 1, the coil assembly 300, 600, 900, 1200, 1400, 1500, 1800, or 2000).

Figure 8:
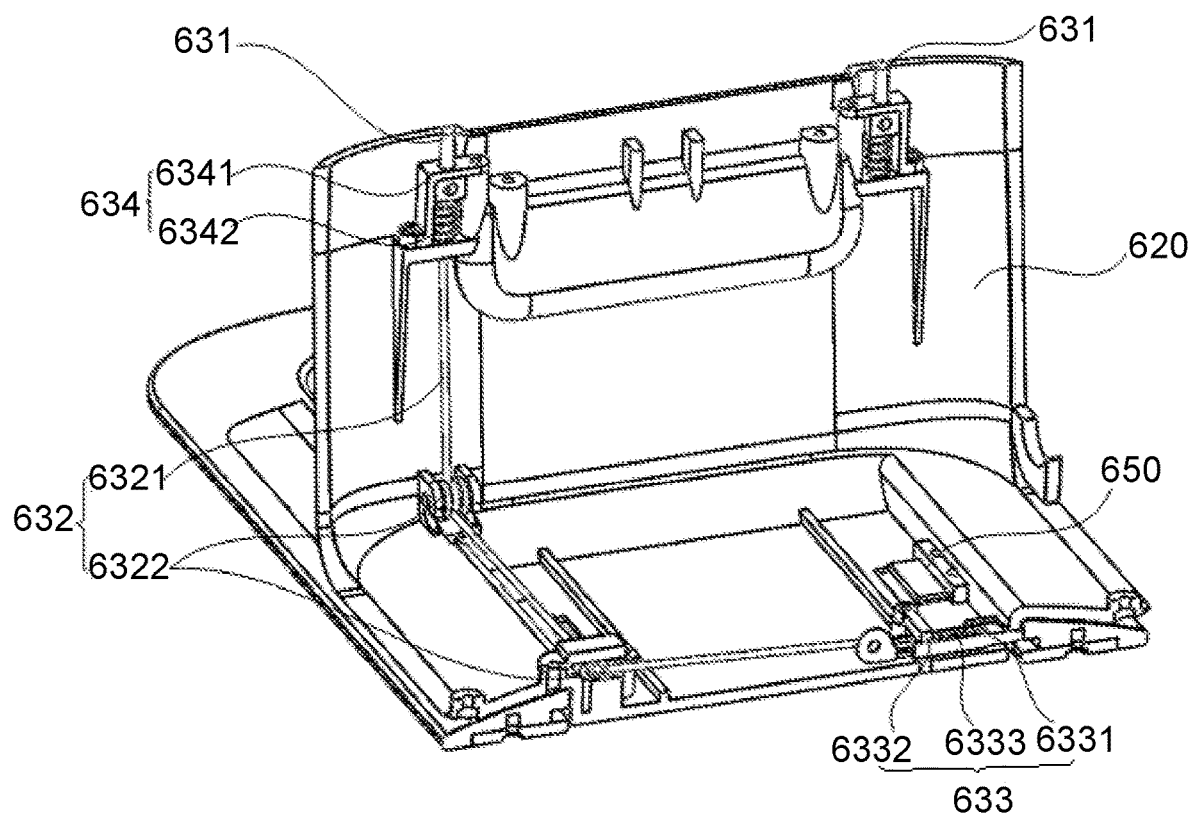
FIG. 8 is a schematic diagram of an exemplary lock mechanism on a second coil portion after being cut out according to some embodiments of the present disclosure.

FIG. 6 is a schematic diagram of an exemplary lock mechanism on a second coil portion of a coil assembly according to some embodiments of the present disclosure. FIG. 7 is a top view of the exemplary lock mechanism on the second coil portion of the coil assembly according to some embodiments of the present disclosure. FIG. 8 is a schematic diagram of the exemplary lock mechanism on the second coil portion after being cut out according to some embodiments of the present disclosure.

In some embodiments, a coil assembly 600 may include a coil, a support component 610, and a lock mechanism 630. The coil may include a first coil portion (not shown in FIGS. 6-8) and a second coil portion 620. As shown in FIG. 6 and FIG. 7, the lock mechanism 630 may include four pressing components 631, two transmission components 632, and a lock component 633. Two of the four pressing components 631 may be connected to the lock component 633 via the two transmission components 632, respectively. The four pressing components 631 may be located on a surface of the second coil portion 620 that abuts the first coil portion when the first coil portion and the second coil portion 620 are locked. The four pressing components 631 may be symmetrical with respect to the surface of the second coil portion 620. An arrangement of the four pressing components 631 may be the same as or similar to the arrangement of the four pressing components 431 in FIG. 4, more descriptions of which may be not repeated.

As shown in FIGS. 6-8, taking a specific transmission component 632 and a specific pressing component 631 connected to the specific transmission component 632 as an example, the transmission component 632 may include a string 6321 and pullies 6322 (e.g., two pullies). The pullies 6322 may be rotatably located on the second coil portion 620. A first end of the string 6321 may be connected to the pressing component 631. A second end of the string 6321 may be wound around the pullies 6322 and connected to the lock component 633. The pressing component 631 may cause the lock component 633 to move via the string 6321.

In some embodiments, the string 6321 may be made of steel, etc. A steering layout of the string 6321 may be achieved by the pullies 6322. The string 6321 may be arranged according to a predetermined trajectory, thereby reducing the space occupied by the string 6321, ensuring an accurate movement transmission, and/or reducing interference of the string 6321 with other components of the coil assembly 600. Besides, by arranging the pullies 6322, a friction between the string 6321 and the pullies 6322 may be reduced, thereby reducing the wear of the string 6321 and improving the working reliability.

As shown in FIGS. 6-8, a count of the pullies 6322 may be two. The two pullies 6322 may be located on a first side edge of a shell 621 of the second coil portion 620. The lock component 633 may be located on a second side edge of the shell 621 of the second coil portion 620 that is opposite to the first side edge. That is, the two pullies 6322 and the lock component 633 may be located on the two side edges of the shell 621 opposite to each other. One of the two pullies 6322 may be located underneath the pressing component 631 along a vertical direction perpendicular to a bottom surface of the shell 621. A remaining pully 6322 may be located on a middle region of the bottom surface the shell 621. After the string 6321 is connected to the pressing component 631, the string 6321 may be respectively wound around the two pullies 6322 and connected to the lock component 633. In some embodiments, the two pullies 6322 may be on a same horizontal plane. In some embodiments, one of the two pullies 6322 may be arranged slightly higher or slightly lower than another pully 6322.

In some embodiments, when the pressing component 631 receives an abutment force of the first coil portion, the string 6321 may be in a tensioned state. At this time, the string 6321 may pull the lock component 633. The lock component 633 may be retracted into the second coil portion 620 to separate from the support component 610, thereby unlocking the second coil portion 620 and the support component 610. When the first coil portion is locked with the second coil portion 620, the first coil portion may apply a pressure on the pressing component 631, and the string 6321 may be in a relaxed state. The string 6321 may no longer pull the lock component 633, and the lock component 633 may keep extending out of the second coil portion 620. The lock component 633 may abut the support component 610 to lock the second coil portion 620 and the support component 610.

It should be noted the above descriptions are for illustration purposes. In some embodiments, a count of the pullies 6322 may be non-limiting, e.g., one, two, three, or more. For example, the transmission component may include only one pully 6322. The pully 6322 may be located underneath the pressing component 631 along the vertical direction perpendicular to the bottom surface of the shell 621. The pully 6322 may be located opposite to the lock component 633. The string 6321 may be wound around the pully 6322 and directly connected to the lock component 633.

As described above, the coil assembly 600 may include the two transmission components 632. In some embodiments, as shown in FIG. 6 and FIG. 7, a first transmission component 632 of the two transmission components 632 may be located on a first side of the shell 621 of the second coil portion 620. A second transmission component 632 of the two transmission components 632 may be located on a second side of the shell 621. In some embodiments, the first side and the second side may be opposite to each other. The two transmission components 632 may be symmetrical with respect to the bottom surface of the shell 621. In such cases, forces received by the lock component 633 may be balanced, avoiding a deviation of the lock component 633 and ensuring the locking or unlocking effect.

In some embodiments, two strings 6321 of the two transmission components 632 may be introduced into a middle region of the shell 621 via corresponding pullies 6322, and connected to the lock component 633, respectively. When the first coil portion is locked with the second coil portion 620, a bottom surface of the first coil portion may be connected to the two pressing components 631 connected to the two transmission components 632. The two pressing components 631 may respectively cause the two transmission components 632 to move, such that the lock component 633 may lock the second coil portion 620 and the support component 610. When the first coil portion is separated from the second coil portion 620, the two pressing components 631 may extend out at the same time. The transmission component 632 may simultaneously cause the lock component 633 to unlock the second coil portion 620 and the support component 610.

In some embodiments, the lock mechanism 630 may include four reset components 634 corresponding to the four pressing components 631. The four reset components 634 may be located on the second coil portion 620. Taking a specific reset component 634 and a corresponding pressing component 631 as an example, the reset component 634 may be configured to reset a position of the pressing component 631. The pressing component 631 may be retractably located on the reset component 634. An automatic reset of the position of the pressing component 631 may be achieved via the reset component 634. In some embodiments, when the first coil portion is locked with the second coil portion 620, the first coil portion may cause the pressing component 631 to overcome an elastic force of the reset component 634 to press the pressing component 631 downward. When the first coil portion is separated from the second coil portion 620, the pressing component 631 may be free of an external force. The elastic force of the reset component 634 may cause the pressing component 631 to reset, such that the pressing component 631 may move upward and return to a free state (i.e., the protruded state).

In some embodiments, the reset component 634 may include a positioning unit 6341 and an elastic unit 6342. The positioning unit 6341 may be located on the second coil portion 620. The pressing component 631 may be movably located on the positioning unit 6341. The elastic unit 6342 may be elastically connected to the positioning unit 6341 and the pressing component 631. The positioning unit 6341 may be a mounting portion of the reset component 634 and support the pressing component 631 to prevent the pressing component 631 from slipping off the shell 621. In some embodiments, the positioning unit 6341 may be a mounting frame that is able to be mounted on the shell 621. It should be noted a form and/or a structure of the positioning unit 6341 may be non-limiting as long as the positioning unit 6341 is able to be mounted on the shell 621.

In some embodiments, the positioning unit 6341 may be fixedly mounted on the shell 621. The pressing component 631 may be retractably mounted on the positioning unit 6341 via the elastic unit 6342. For example, the elastic unit 6342 may include a spring. An elastic force of the elastic unit 6342 may pull up the pressing component 631, such that the pressing component 631 may extend out of the shell 621.

When the first coil portion is locked with the second coil portion 620, the bottom surface of the first coil portion may contact with the pressing component 631, and press the pressing component 631 against the elastic force of the elastic unit 6342. After the pressing component 631 is retracted into the shell 621, the bottom surface of the first coil portion may contact with a top surface of the second coil portion 620, and the first coil portion may be locked with the second coil portion 620. When the first coil portion is separated from the second coil portion 620, the pressing component 631 is free of the external force. The elastic force of the elastic unit 6342 may pull up the pressing component 631, and the pressing component 631 may move upward and return to the free state. At this time, the pressing component 631 may partially protrude beyond an upper surface of the second coil portion 620. The upper surface of the second coil portion 620 may contact the bottom surface of the first coil portion when the first coil portion and the second coil portion 620 are locked.

The lock pin 6331 may be a main piece configured to perform the locking of the second coil portion 620 and the support component 610. A form of the lock pin 6331 may be non-limiting as long as the lock pin 6331 locks the second coil portion 620 and the support component 610. For example, the lock pin 6331 may have a cylindrical shape, a sheet shape, a bar shape, or the like, or any combination thereof. In some embodiments, the lock pin 6331 may be retractably mounted on the positioning unit 6332 via the elastic unit 6333. For example, the elastic unit 6333 may be a spring.

When the lock pin 6331 is free of the external force, or the external force received by the lock pin 6331 is smaller than the elastic force of the elastic unit 6333, the elastic unit 6333 may push the lock pin 6331 out, making the lock pin 6331 abut the support component 610. At this time, the lock pin 6331 may lock the second coil portion 620 and the support component 610. When the external force received by the lock pin 6331 is greater than the elastic force of the elastic unit 6333, the lock pin 6331 may overcome the elastic force of the elastic unit 6333 under the external force, such that the lock pin 6331 may compress the elastic unit 6333 to retract into the shell 621. At this time, an end of the lock pin 6331 may be separated from the support component 610. The second coil portion 620 and the support component 610 are unlocked.

In some embodiments, two of the four pressing components 631 may cooperate with two of the four reset components 634 and the two transmission components 632 to cause a movement of the lock component 633. In some embodiments, the two pressing components 631 and the two reset components 634 may be located on a first edge of the shell 621. Two remaining pressing components 631 and two remaining reset components 634 may be symmetrically located on a second edge of the shell 621 that is different from the first edge. In such cases, forces received by the first coil portion may be balanced when the first coil portion is locked with the second coil portion 620, thereby ensuring a connection consistency of the first coil portion and the second coil portion 620. It should be noted that the above descriptions are for illustration purposes and non-limiting. A count of the reset components 634 of the coil assembly 600 may be non-limiting, e.g., one, two, three, four, or more. For example, the coil assembly 600 may include two reset components 634 corresponding to the two transmission components 632 and two of the four pressing components 631 connecting the two transmission components 632.

In some embodiments, as shown in FIGS. 6 and 7, the coil assembly 600 may also include guiding mechanisms 650. The guiding mechanisms 650 may be configured to guide the second coil portion 620 to move along a predetermined direction (e.g., a length direction of the support component 610) with respect to the support component 610. More descriptions of the guiding mechanisms 650 may be found elsewhere in the present disclosure. See, e.g., FIGS. 15-17, or the descriptions thereof.

In some embodiments, a working process of the transmission component 632 including the string 6321 and the pullies 6322 may be described below. Still taking a specific transmission component 632 and a specific pressing component 631 connected to the specific transmission component 632 as an example, when the first coil portion and the second coil portion 620 are in an unlocked state, that is, when the first coil portion is separated from the second coil portion 620, the pressing component 631 may extend out of the shell 621 under an elastic force of the elastic unit 6342, and be in a protruded state. After the pressing component 631 is in the protruded state, the pressing component 631 may pull the string 6321 to cause the string 6321 in a tensioned state. The string 6321 may pull the lock pin 6331 such that the lock pin 6331 may overcome the elastic force of the elastic unit 6333 and retract into the shell 621. The lock pin 6331 may be separated from the support component 610, such that the second coil portion 620 and the support component 610 are unlocked. In such cases, the second coil portion 620 may be moveable relative to the support component 610 to adjust a position of the second coil portion 620.

After the second coil portion 620 is adjusted to a target position (e.g., the target position in FIG. 3), the first coil portion may be locked with the second coil portion 620. A bottom surface of the first coil portion may contact with the pressing component 631. The first coil portion may overcome the elastic force of the elastic unit 6342 to press the pressing component 631 downward, and the pressing component 631 may retract into the shell 621. The pressing component 631 may no longer pull the string 6321, an external force received by the string 6321 may disappear, and the string 6321 may be in a relaxed state. Further, an external force received by the lock pin 6331 may disappear, and the lock pin 6331 may extend out of the shell 621 under the elastic unit 6333 and abut the support component 610, thereby locking the second coil portion 620 and the support component 610.

It should be noted that components of the coil assembly 600 other than the transmission component 632 may be the same as or similar to the coil assembly (e.g., the coil assembly in FIG. 1, the coil assembly 400, 500, 900, 1200, 1400, 1500, 1800, or 2000) described elsewhere in the present disclosure, the descriptions of which may be not repeated. It should also be noted that a count of the pressing component 631 and/or a count of the transmission component 632 included in the coil assembly 600 may be non-limiting.

Figure 9:
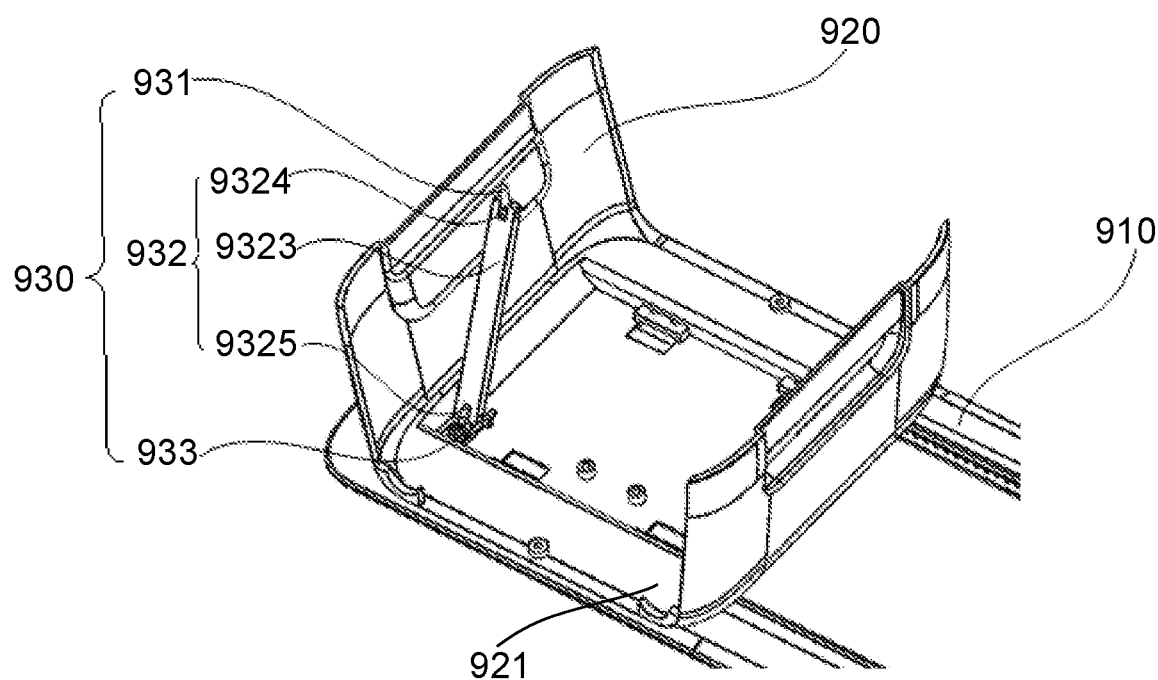
FIG. 9 is a schematic diagram of an exemplary lock mechanism on a second coil portion of a coil assembly according to some embodiments of the present disclosure.
Figure 10:
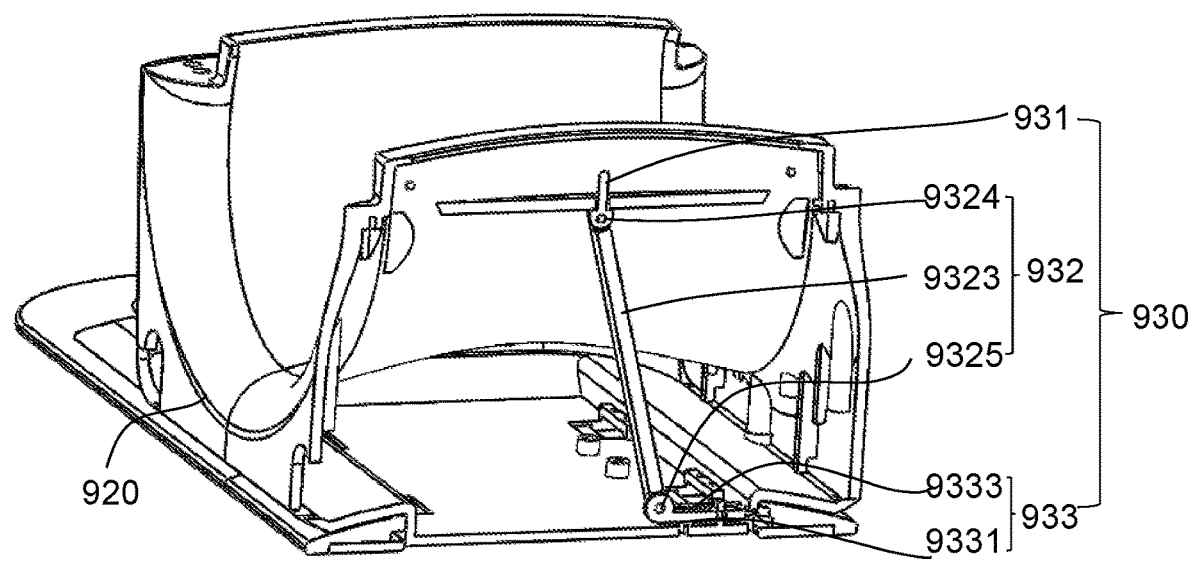
FIG. 10 is a schematic diagram of an exemplary lock mechanism on a second coil portion of a coil assembly after being cut out according to some embodiments of the present disclosure.
Figure 11:
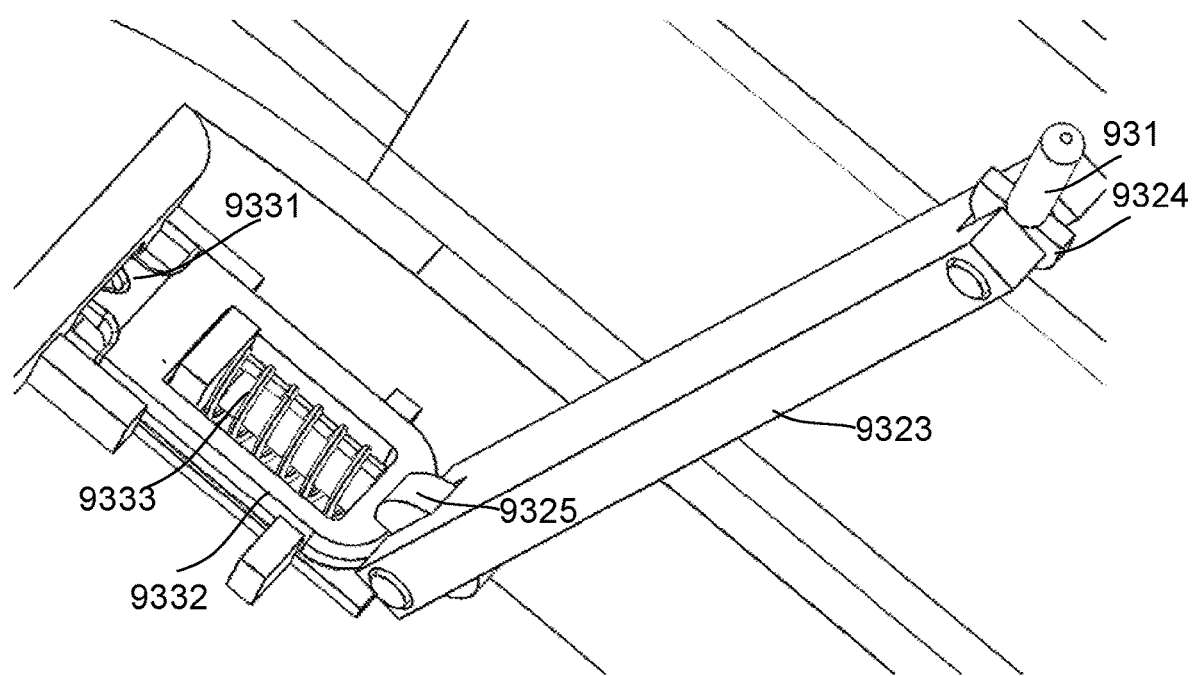
FIG. 11 is a schematic diagram of an exemplary lock mechanism on a second coil portion of a coil assembly according to some embodiments of the present disclosure.

FIG. 9 is a schematic diagram of an exemplary lock mechanism on a second coil portion of a coil assembly according to some embodiments of the present disclosure. FIG. 10 is a schematic diagram of the exemplary lock mechanism on the second coil portion of the coil assembly after being cut out according to some embodiments of the present disclosure. FIG. 11 is a schematic diagram of the exemplary lock mechanism on the second coil portion of the coil assembly according to some embodiments of the present disclosure.

In some embodiments, the coil assembly 900 may include a support component 910, a coil, and a lock mechanism 930. The coil may include a first coil portion (not shown in FIG. 9) and a second coil portion 920. The lock mechanism 930 may include a pressing component 931, a transmission component 932, and a lock component 933. As shown in FIG. 9-11, the lock component 933 may include a lock pin 9331, an elastic unit 9333, and a positioning unit 9332. The lock pin 9331 may be connected to the transmission component 932. The positioning unit 9332 may be located on the second coil portion 920. The lock pin 9331 may be movably located on the positioning unit 9332. The elastic unit 9333 may be elastically connected to the positioning unit 9332 and the lock pin 9331.

As shown in FIGS. 9-11, the transmission component 932 may include a rod 9323, a first rotation component 9324, and a second rotation component 9325. A first end of the rod 9323 may be rotatably connected to the pressing component 931 via the first rotation component 9324. A second end of the rod 9323 may be rotatably connected to the lock component 933 via the second rotation component 9325. The pressing component 931 may cause the lock component 933 to move via the rod 9323.

A movement transmission may be achieved by the rod 9323, the first rotation component 9324, and the second rotation component 9325. In some embodiments, the first rotation component 9324 or the second rotation component 9325 may be a rotatable shaft, a hinge, etc. The rod 9323 may be swingable. The rod 9323 may be swingably located on a shell 921 of the second coil portion 920. A bottom of the rod 9323 may contact with a bottom wall of the shell 921. A top of the rod 9323 may extend out of the second coil portion 920 via the pressing component 931. The pressing component 931 and the first end of the rod 9323 may be connected via the first rotation component 9324. The pressing component 931 may be rotatable relative to the rod 9323. The second end of the rod 9323 may be rotatably connected to the lock pin 9331 of the lock component 933 via the second rotation component 9325. The lock pin 9331 may be rotatable relative to the rod 9323.

When the first coil portion is locked with the second coil portion 920, a bottom surface of the first coil portion may abut the pressing component 931. The pressing component 931 may push the rod 9323 to swing on the shell 921 along a first direction. The rod 9323 may push the lock component 933 to extend out of the shell 921, such that the lock component 933 may abut the support component 910. At this time, the lock component 933 may lock the second coil portion 920 and the support component 910. After the first coil portion is separated from the second coil portion 920, an elastic force of the lock component 933 may cause the lock component 933 to retract into the shell 921, and cause the rod 9323 to swing on the shell 921 along a second direction opposite to the first direction, thereby pushing the pressing component 931 out of the second coil portion 920.

In some embodiments, the structure of the lock component 933 may be the same as or similar to the lock component 633 in FIGS. 6-8, except that the force received by the elastic unit 9333 may be different. In some embodiments, the elastic unit 9333 may be a tensile elastic piece. When the lock pin 9331 is free of an external force, or the external force received by the lock pin 9331 is smaller than an elastic force of the elastic unit 9333, the elastic unit 9333 may cause the lock pin 9331 to retract into the second coil portion 920, such that the lock pin 9331 and the support component 910 may be separated and the second coil portion 920 and the support component 910 may be unlocked. When the external force received by the lock pin 9331 is greater than the elastic force of the elastic unit 9333, the lock pin 9331 may overcome the elastic force of the elastic unit 9333 under the external force, such that the lock pin 9331 may cause the elastic unit 9333 to stretch and extend out of the shell 921. At this time, an end of the lock pin 9331 may abut the support component 910 to lock the second coil portion 920 and the support component 910.

In some embodiments, a working process of the transmission component 932 including the rod 9323, the first rotation component 9324, and the second rotation component 9325 may be described below. When the first coil portion and the second coil portion 920 are in an unlocked state, that is, when the first coil portion is separated from the second coil portion 920, the elastic unit 9333 may cause the lock pin 9331 to retract into the shell 921. The lock pin 9331 may be separated from the support component 910, such that the second coil portion 920 and the support component 910 may be unlocked. At this time, the second coil portion 920 may be movable relative to the support component 910 to adjust a position of the second coil portion 920. The rod 9323 may swing under an elastic force of the elastic unit 9333 to cause the pressing component 931 to extend out of the shell 921. At this time, the pressing component 931 may be in a protruded state.

After the second coil portion 920 is adjusted to a target position (e.g., the target position in FIG. 3), the first coil portion may be locked with the second coil portion 920. A bottom surface of the first coil portion may contact with the pressing component 931. The pressing component 931 may be pressed downward and retracted into the shell 921. The pressing component 931 may cause the rod 9323 to swing on the shell 921. The rod 9323 may overcome the elastic force of the elastic unit 9333 to push the lock pin 9331 out of the shell 921. The lock pin 9331 may abut the support component 910 to lock the second coil portion 920 with the support component 910.

It should be noted that components of the coil assembly 900 other than the transmission component 932 may be the same as or similar to the coil assembly (e.g., the coil assembly in FIG. 1, the coil assembly 400, 500, 600, 1200, 1400, 1500, 1800, or 2000) described elsewhere in the present disclosure, the descriptions of which may be not repeated. It should also be noted that a count of the pressing component 931 and/or a count of the transmission component 932 included in the coil assembly 900 may be non-limiting.

Figure 12:
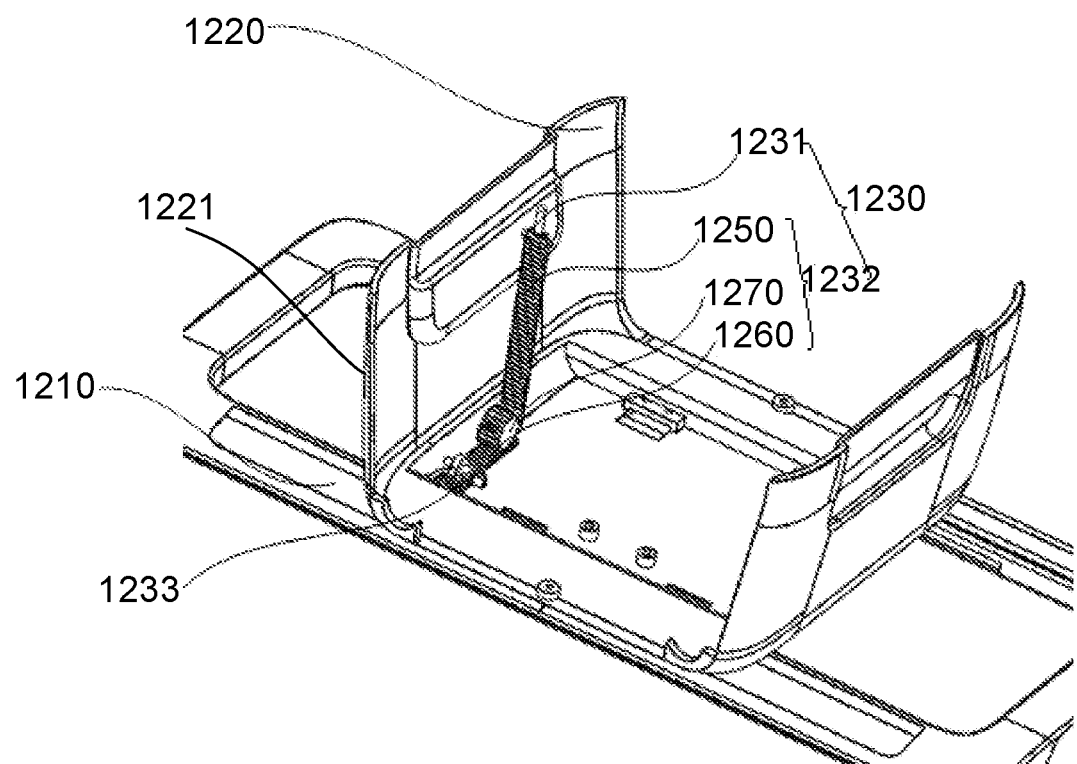
FIG. 12 is a schematic diagram of an exemplary lock mechanism on a second coil portion of a coil assembly according to some embodiments of the present disclosure.
Figure 13:
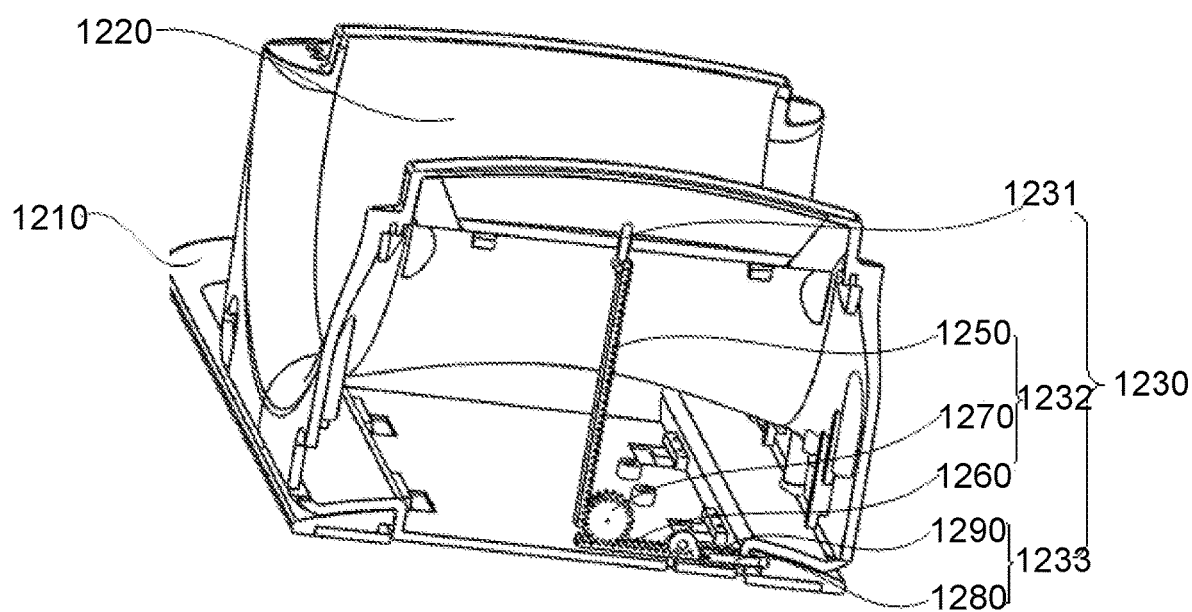
FIG. 13 is a schematic diagram of an exemplary lock mechanism on a second coil portion of a coil assembly after being cut out according to some embodiments of the present disclosure.

FIG. 12 is a schematic diagram of an exemplary lock mechanism on a second coil portion of a coil assembly according to some embodiments of the present disclosure. FIG. 13 is a schematic diagram of the exemplary lock mechanism on the second coil portion of the coil assembly after being cut out according to some embodiments of the present disclosure.

In some embodiments, the coil assembly 1200 may include a support component 1210, a coil, and a lock mechanism 1230. The coil may include a first coil portion (not shown in FIG. 12 and FIG. 13) and a second coil portion 1220. The lock mechanism 1230 may include a pressing component 1231, a transmission component 1232, and a lock component 1233.

As shown in FIG. 12 and FIG. 13, the transmission component 1232 may include a first rack 1250, a second rack 1260, and a gear 1270. The first rack 1250 may be connected to the pressing component 1231 and the gear 1270. The second rack 1260 may be connected to the gear 1270 and the lock component 1233. The pressing component 1231 may cause the lock component 1233 to move via the first rack 1250, the gear 1270, and the second rack 1260.

In some embodiments, a shell 1221 of the second coil portion 1220 may include a hole. For example, the hole may be perpendicular to a bottom surface of the shell 1221. As another example, the hole may be parallel to a side surface of the shell 1221. The pressing component 1231 may penetrate the hole and move up and/or down (e.g., along the side surface of the shell 1221) via the hole. The pressing component 1231 may be fixedly connected to the first rack 1250. The gear 1270 may be connected to the first rack 1250 and the second rack 1260. The first rack 1250 may be perpendicular to the second rack 1260. For example, the first rack 1250 may be located in a vertical direction (e.g., along the side surface of the shell 1221), and the second rack 1260 may be located at a horizontal direction (e.g., along the bottom surface of the shell 1221). The first rack 1250, the second rack 1260, and the gear 1270 may have the same module and the same width. In some embodiments, the shell 1221 may have a limiting groove. The second rack 1260 may be movably located on the limiting groove. An end of the second rack 1260 may be connected to the lock component 1233. In such cases, the lock component 1233 may be movable along a predetermined direction to lock or unlock the second coil portion 1220 and the support component 1210.

When the first coil portion is locked with the second coil portion 1220, a bottom surface of the first coil portion may abut the pressing component 1231. The pressing component 1231 may push the first rack 1250 to move downward. The first rack 1250 may cause the gear 1270 to rotate. At the same time, the gear 1270 may cause the second rack 1260 that is meshed with the gear 1270 to move along a first direction. The lock component 1233 may be pushed to extend out of the shell 1221, such that the lock component 1233 may abut the support component 1210. At this time, the lock component 1233 may lock the second coil portion 1220 and the support component 1210. After the first coil portion is separated from the second coil portion 1220, an elastic force of the lock component 1233 may cause the lock component 1233 to retract into the shell 1221. The second rack 1260 may be caused to move in the shell 1221 along a second direction opposite to the first direction. The second rack 1260 may cause the gear 1270 to rotate. At the same time, the gear 1270 may cause the first rack 1250 meshed with the gear 1270 to move upward. The pressing component 1231 may be pushed out of the second coil portion 1220.

As shown in FIG. 13, the lock component 1233 may include a lock pin 1280, an elastic unit 1290, a positioning unit (not shown in FIG. 13), etc. The lock pin 1280 may be connected to the transmission component 1232. The positioning unit may be located on the second coil portion 1220. The lock pin 1280 may be movably located on the positioning unit. The elastic unit 1290 may be elastically connected to the positioning unit and the lock pin 1280. A structure and/or principle of the lock component 1233 may be similar to the structure and/or principle of the lock component 933 in FIGS. 9-11, more descriptions of which may be not be repeated.

In some embodiments, a working process of the transmission component 1232 including the first rack 1250, the second rack 1260, and the gear 1270 may be described below. When the first coil portion and the second coil portion 1220 are in an unlocked state, that is, when the first coil portion is separated from the second coil portion 1220, the elastic unit 1290 may cause the lock pin 1280 to retract into the shell 1221. The lock pin 1280 may be separated from the support component 1210, such that the second coil portion 1220 and the support component 1210 may be unlocked. At this time, the second coil portion 1220 may be movable relative to the support component 1210 to adjust a position of the second coil portion 1220. The second rack 1260 may move under an elastic force of the elastic unit 1290 and cause the gear 1270 to rotate. The gear 1270 may cause the first rack 1250 meshed with the gear 1270 to move upward to allow the pressing component 1231 to extend out of the shell 1221. In such cases, the pressing component 1231 may be in a protruded state.

After the second coil portion 1220 is adjusted to a target position (e.g., the target position in FIG. 3), the first coil portion may be locked with the second coil portion 1220. The bottom surface of the first coil portion may contact with the pressing component 1231. The pressing component 1231 may be pressed downward. The pressing component 1231 may retract into the shell 1221. The pressing component 1231 may push the first rack 1250 to move downward. The first rack 1250 may cause the gear 1270 to rotate. At the same time, the gear 1270 may cause the second rack 1260 meshed with the gear 1270 to move. The lock pin 1280 may be pushed out of the shell 1221 and abut the support component 1210, thereby locking the second coil portion 1220 and the support component 1210.

It should be noted that components of the coil assembly 1200 other than the transmission component 1232 may be the same as or similar to the coil assembly (e.g., the coil assembly in FIG. 1, the coil assembly 400, 500, 600, 900, 1400, 1500, 1800, or 2000) described elsewhere in the present disclosure, the descriptions of which may be not repeated. It should also be noted that a count of the pressing component 1231 and/or a count of the transmission component 1232 included in the coil assembly 1200 may be non-limiting.

Figure 14:
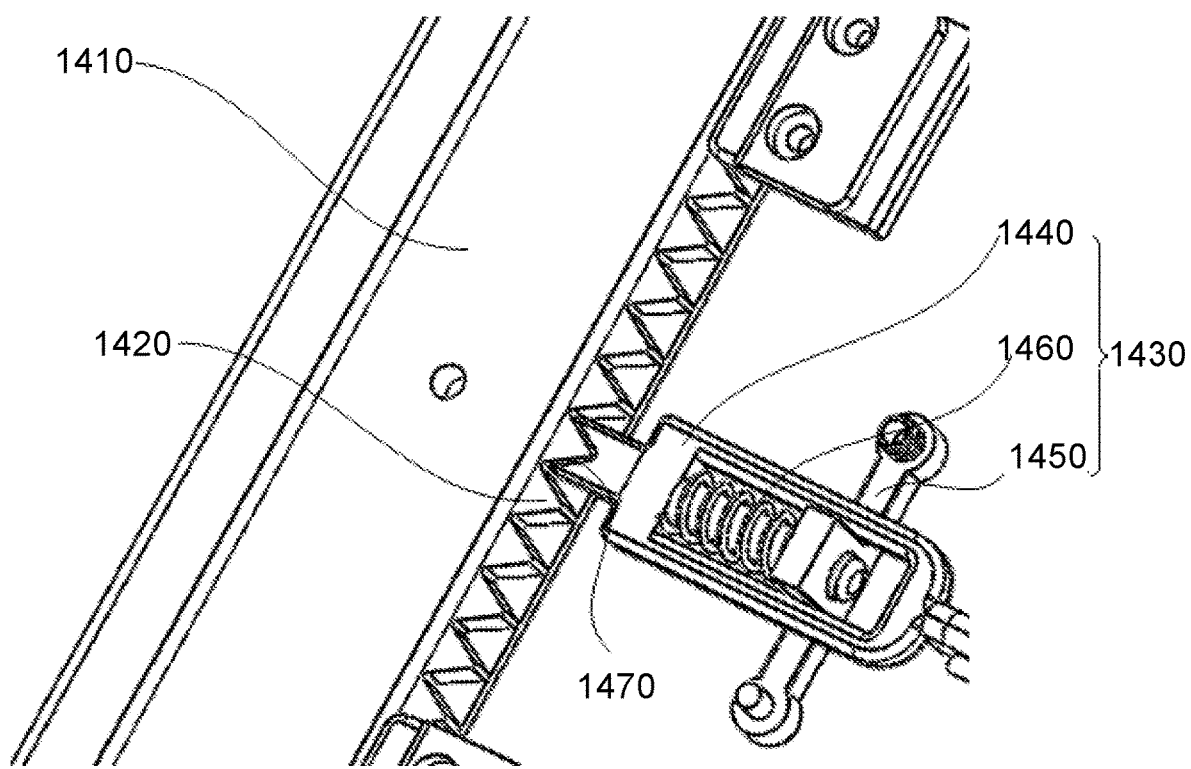
FIG. 14 is a schematic diagram of an exemplary contact between a lock pin of a lock mechanism on a second coil portion and a support component according to some embodiments of the present disclosure.

FIG. 14 is a schematic diagram of an exemplary contact between a lock pin of a lock mechanism on a second coil portion and a support component according to some embodiments of the present disclosure.

In some embodiments, a coil assembly 1400 may include a support component 1410, a lock mechanism, and a coil (not shown in FIG. 14) including a first coil portion and a second coil portion. In some embodiments, the lock mechanism may include at least one pressing component, at least one transmission component (e.g., a string, at least one pully), and a lock component 1430. The lock component 1430 may include a lock pin 1440, an elastic unit 1460, and a positioning unit 1450.

As shown in FIG. 14, an end of the lock pin 1440 may include a first matching portion 1470. The support component 1410 may include a second matching portion 1420. The first matching portion 1470 may match the second matching portion 1420 to limit a movement of the lock pin 1440. In some embodiments, when the second coil portion and the support component 1410 are locked, the first matching portion 1470 may contact with the second matching portion 1420. When the second coil portion and the support component 1410 are unlocked, the first matching portion 1470 may be separated from the second matching portion 1420. After the first matching portion 1470 and the second matching portion 1420 are matched, the lock pin 1440 may be reliably contacted with the support component 1410, thereby preventing the movement of the lock pin 1440 and ensuring the locking reliability.

As shown in FIG. 14, the first matching portion 1470 may include a groove, and the second matching portion 1420 may be a teeth portion including at least one tooth arranged in parallel and matched with the groove. For example, the first matching portion 1470 may include a V-shaped groove, and the second matching portion 1420 may include a protruding teeth portion. The V-shaped groove and the teeth portion may be matched and tightly connected to each other under an elastic force of the elastic unit 1460, ensuring the locking reliability. It should be noted that the above descriptions are for illustration purposes and non-limiting. In some embodiments, the first matching portion 1470 may include the teeth portion, and the second matching portion 1420 may include the groove. In some embodiments, the first matching portion 1470 may include a cylinder protrusion, and the second matching portion 1420 may include a groove matched with the cylinder protrusion. In some embodiments, the second matching portion 1420 may include a cylinder protrusion, and the first matching portion 1470 may include a groove matched with the cylinder protrusion.

In some embodiments, components of the coil assembly 1400 other than the lock component 1430 may be the same as or similar to those of other coil assemblies (e.g., the coil assembly in FIG. 1, the coil assembly 300, 400, 500, 600, 1800, or 2000) described elsewhere in the present disclosure, the description of which may be not repeated here.

Figure 15:
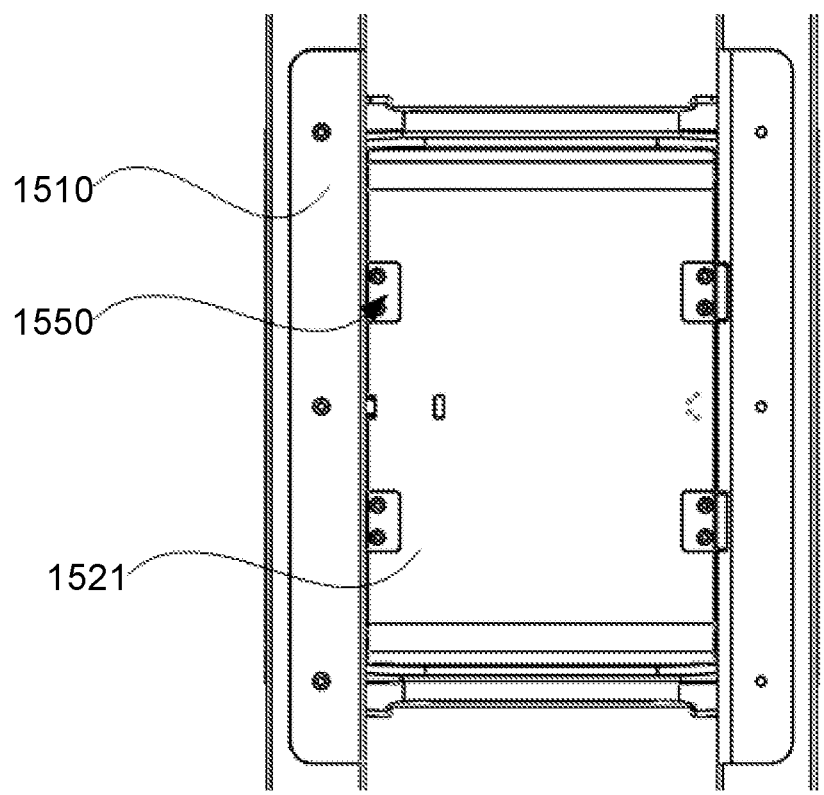
FIG. 15 is a section view of an exemplary guiding mechanism on a second coil portion after the second coil portion is connected to a support component according to some embodiments of the present disclosure.
Figure 16:
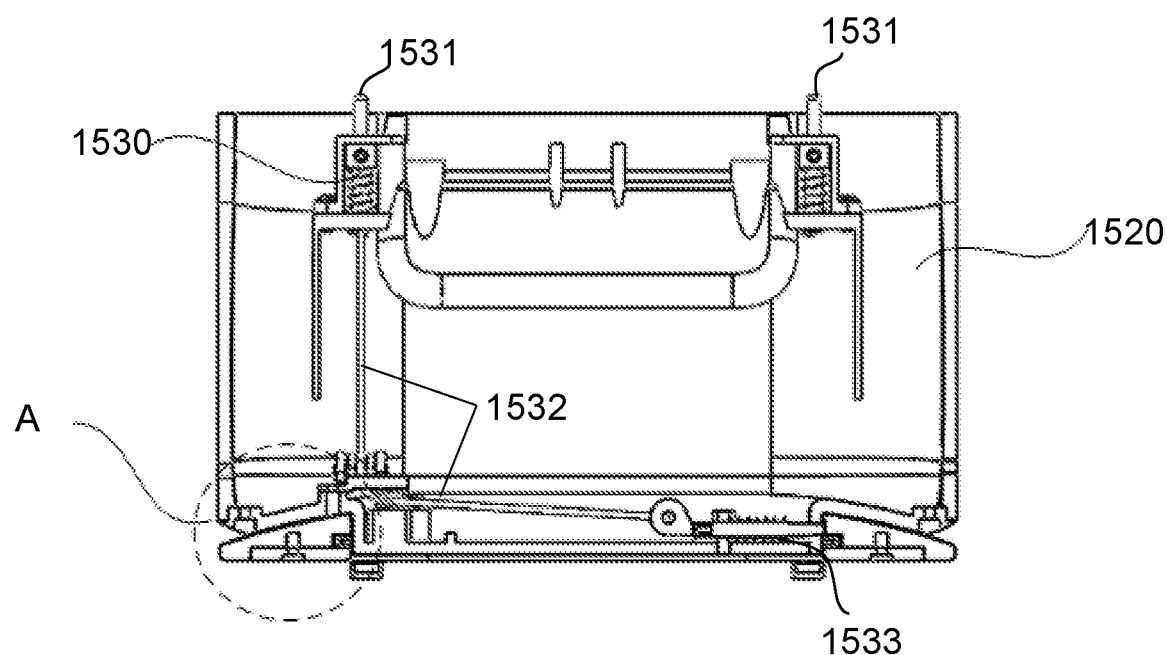
FIG. 16 is a section view of an exemplary guiding mechanism on a second coil portion after the second coil portion is connected to a support component according to some embodiments of the present disclosure.
Figure 17:
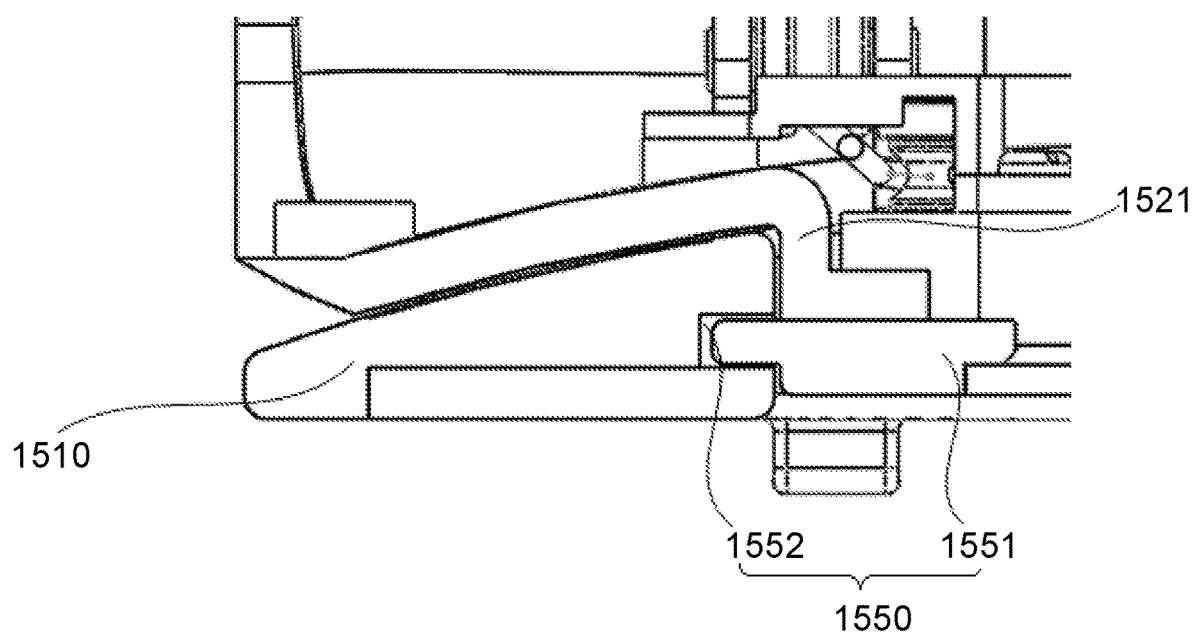
FIG. 17 is an enlarged view of a portion A of an exemplary guiding mechanism on a second coil portion after the second coil portion is connected to a support component according to some embodiments of the present disclosure.

FIG. 15 is a section view of an exemplary guiding mechanism on a second coil portion after the second coil portion is connected to a support component according to some embodiments of the present disclosure. FIG. 16 is a section view of the exemplary guiding mechanism on the second coil portion after the second coil portion is connected to the support component according to some embodiments of the present disclosure. FIG. 17 is an enlarged view of a portion A of the exemplary guiding mechanism on the second coil portion after the second coil portion is connected to the support component according to some embodiments of the present disclosure.

In some embodiments, a coil assembly 1500 may include a support component 1510, a lock mechanism 1530, and a coil including a first coil portion and a second coil portion 1520. The lock mechanism 1530 may include pressing components 1531, at least one transmission component 1532, and a lock component 1533.

As shown in FIG. 15 and FIG. 17, the coil assembly 1500 may also include a guiding mechanism 1550 connected to the second coil portion 1520 and the support component 1510. The guiding mechanism 1550 may be configured to guide the second coil portion 1520 to move along the support component 1510. In some embodiments, the guiding mechanism 1550 may provide a guiding function for guiding the second coil portion 1520 to move along a predetermined trajectory and along the support component 1510, thereby avoiding the second coil portion 2020 deviating from the support component 1510, and ensuring a reliable locking of the lock mechanism 1530.

As shown in FIG. 17, the guiding mechanism 1550 may include a guiding component 1551. The support component 1510 (e.g., a shell 1521 thereof) may include a slot 1552. A first end of the guiding component 1551 may be fixed on the second coil portion 1520. A second end of the guiding component 1551 may be inserted into the slot 1552 and slidable along the slot 1552. When the second coil portion 1520 moves relative to the support component 1510, the guiding component 1551 may slide along the slot 1552 for guiding the movement of at least a portion of the second coil portion 1520, avoiding the second coil portion 1520 from moving arbitrarily. In some embodiments, a cross-section of the guiding mechanism 1550 may have a U-shape, and a cross-section of the slot may have a U-shape.

In some embodiments, components of the coil assembly 1500 other than the guiding mechanism 1550 may be the same as or similar to those of other coil assemblies (e.g., the coil assembly in FIG. 1, the coil assembly 300, 400, 500, 600, 900, 1200, 1400, 1800, or 2000) described elsewhere in the present disclosure, the description of which may be not repeated here.

Figure 18:
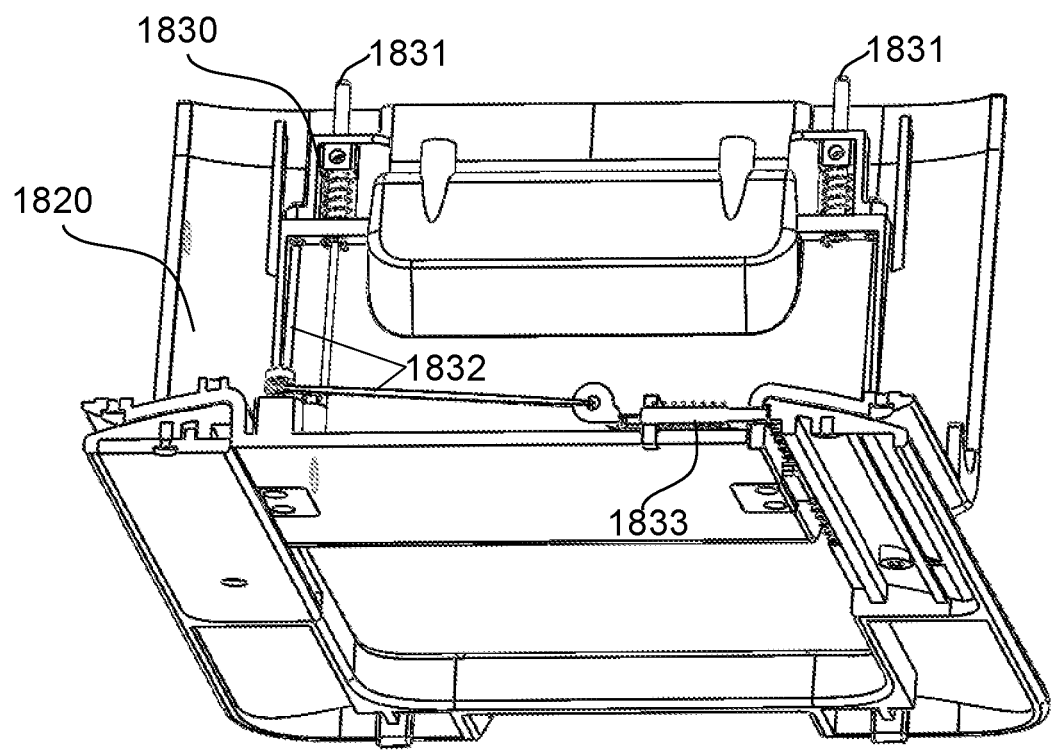
FIG. 18 is a schematic diagram of an exemplary coil assembly after a second coil portion and a support component are locked according to some embodiments.
Figure 19:
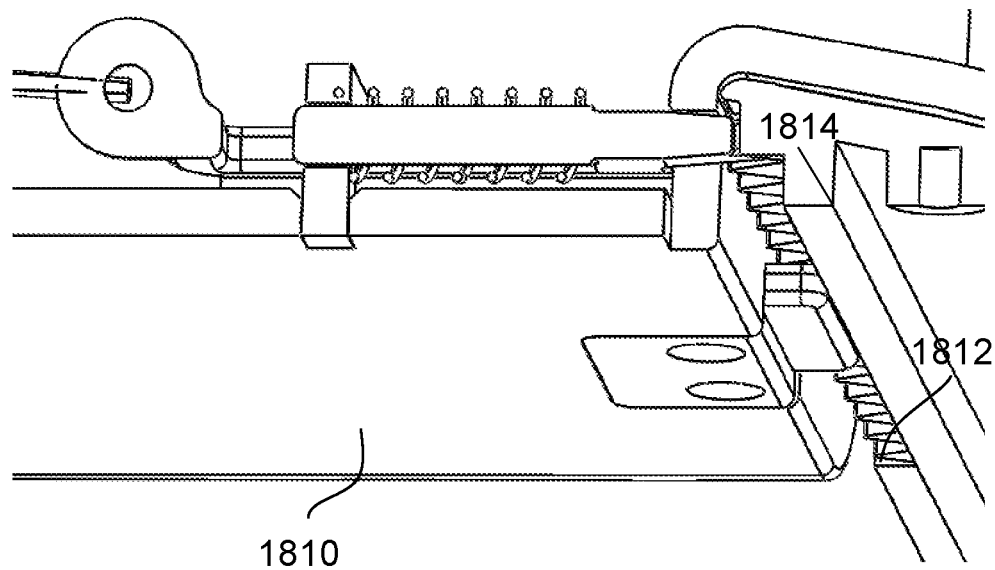
FIG. 19 is an enlarged view of a portion of an exemplary coil assembly after a second coil portion and a support component are locked according to some embodiments.

FIG. 18 is a schematic diagram of an exemplary coil assembly after a second coil portion and a support component are locked according to some embodiments. FIG. 19 is an enlarged view of a portion of the exemplary coil assembly after the second coil portion and the support component are locked according to some embodiments of the present disclosure.

In some embodiments, a coil assembly 1800 may include a support component 1810, a lock mechanism 1830, and a coil including a first coil portion (not shown in FIG. 18) and a second coil portion 1820. The lock mechanism 1830 may include pressing components 1831, at least one transmission component 1832, and a lock component 1833.

As shown in FIG. 19, the support component 1810 may include a second matching portion 1812 (e.g., a teeth portion) that is configured to match a first matching portion (e.g., a groove) (not shown in FIG. 19) of a lock pin of the lock component 1833 to limit a movement of the lock pin. In some embodiments, when the second coil portion 1820 and the support component 1810 are locked, the first matching portion may be moved to contact with the second matching portion 1812, such that the second coil portion 1820 and the support component 1810 may be locked. When the second coil portion 1820 and the support component 1810 are unlocked, the first matching portion may be moved to separate from the second matching portion 1812, such that the second coil portion 1820 and the support component 1810 may be unlocked.

In some embodiments, the coil assembly 1800 may include a guiding mechanism (not shown in FIG. 18 and FIG. 19). The guiding mechanism may include a guiding component. The support component 1810 may include a slot 1814 (e.g., a C-shaped slot) below the second matching portion 1812 shown in FIG. 19. In some embodiments, a first end of the guiding component may be fixed on the second coil portion 1520. A second end of the guiding component may be inserted into the slot 1814 and slide along the slot 1552 to guide the movement of the first matching portion in response to the locking or unlocking of the first coil portion and the second coil portion 1820.

Figure 20:
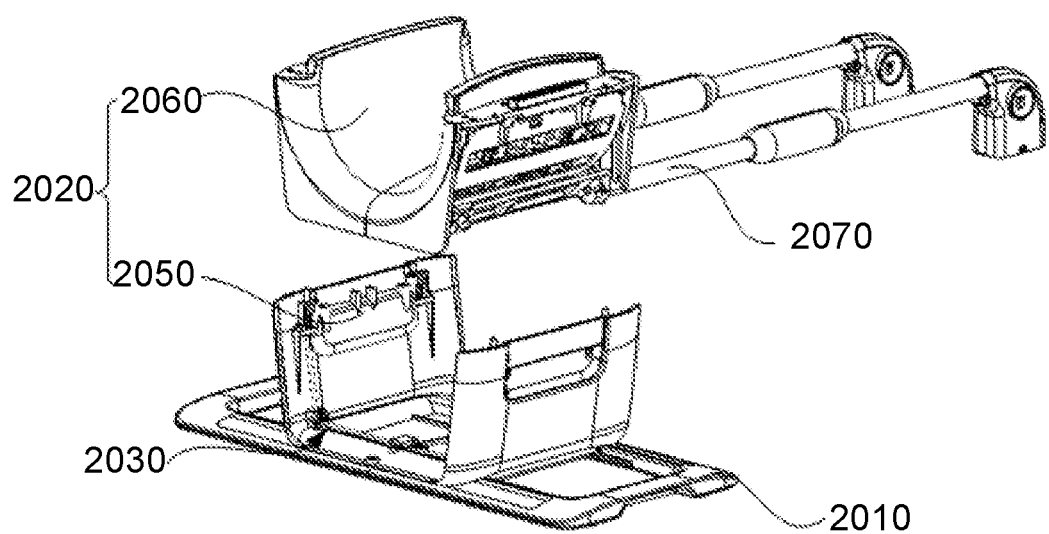
FIG. 20 is a schematic diagram of an exemplary coil assembly according to some embodiments of the present disclosure.

FIG. 20 is a schematic diagram of an exemplary coil assembly according to some embodiments of the present disclosure.

In some embodiments, a coil assembly 2000 may include a support component 2010, a lock mechanism 2030, and a coil including a first coil portion (not shown in FIG. 20) and a second coil portion 2020. The support component 2010 may be configured to support the coil and/or the lock mechanism 2030.

In some embodiments, the first coil portion may include a first antenna and a first connector. As shown in FIG. 20, the second coil portion 2020 may include a shell 2050 and an antenna support component 2060. In some embodiments, the antenna support component 2060 may be configured to support and/or facilitate a mounting of a second antenna, a cable 2070, a second connector, etc. In some embodiments, a top surface of the antenna support component 2060 may be matched with the first coil portion, such that the first connector of the first coil portion may be connected to (e.g., be contacted with) the second connector of the second coil portion 2020. The first antenna of the first coil portion and the second antenna of the second coil portion 2020 may form a complete radio frequency antenna.

In some embodiments, the shell 2050 may be configured to support the antenna support component 2060 and the lock mechanism 2030. The antenna support component 2060 may support the first coil portion. In some embodiments, the shell 2050 may be movably mounted on the support component 2010. A position of the second coil portion 2020 relative to a table (e.g., the table 170) may be adjustable. In some embodiments, the lock mechanism 2030 may be located on the shell 2050. The lock mechanism 2030 may be configured to lock or unlock the shell 2050 and the support component 2010.

In some embodiments of the present disclosure, a method for controlling a coil assembly may be provided. The coil assembly may include a coil, a support component, and a lock mechanism. The coil may include a first coil portion and a second coil portion detachably connected to the first coil portion. The support component may be configured to support the coil. The lock mechanism may be configured to lock or unlock the second coil portion and the support component. In some embodiments, the second coil portion may be caused to move to a position (e.g., the target position described in FIG. 3) along a direction (e.g., a length direction) of the support component. For example, the second coil portion may be automatically moved to the position. As another example, the second coil portion may be moved to the position by an operator of an MRI system (e.g., the MRI system 100).

In some embodiments, the first coil portion and the second coil portion may be locked at the position. In response to the locking of the first coil portion and the second coil portion, the second coil portion and the support component may be locked via the lock mechanism. In some embodiments, the coil may cover a region of a subject to be examined. For example, the region may be placed within a cavity formed by the coil at the position during an imaging of the region. It should be noted that the coil assembly described above may be the same as or similar to other coil assemblies (e.g., the coil assembly in FIG. 1, the coil assembly 300, 400, 500, 600, 900, 1200, 1400, 1500, 1800, or 2000) described elsewhere in the present disclosure, the descriptions of which may be not repeated.

In some embodiments of the present disclosure, an MRI system may be provided. The MRI system may include a magnet (e.g., the magnet 111), a table (e.g., the table 170), and a coil assembly. The magnet may be configured to form a detection space. The table may be configured to support a subject to be examined inside the detection space. The coil assembly may be configured to transmit or receive an MR signal.

In some embodiments, the coil may include a first coil portion and a second coil portion detachably connected to the first coil portion. The support component may be configured to support the coil. The lock mechanism may be configured to lock or unlock the second coil portion and the support component. The second coil portion may be locked, via the lock mechanism, with the support component when the first coil portion and the second coil portion are in a locked state. The second coil portion may be locked with the support component via the lock mechanism by locking the first coil portion and the second coil portion. The second coil portion may be unlocked, via the lock mechanism, from the support component when the first coil portion and the second coil portion are in an unlocked state. The second coil portion may be unlocked from the support component via the lock mechanism by unlocking the first coil portion and the second coil portion. It should be noted that the coil assembly described above may be the same as or similar to other coil assemblies (e.g., the coil assembly in FIG. 1, the coil assembly 300, 400, 500, 600, 900, 1200, 1400, 1500, 1800, or 2000) described elsewhere in the present disclosure, the descriptions of which may be not repeated.

In some embodiments of the present disclosure, a coil assembly may be provided. The coil assembly may include a support component, a coil, and a lock mechanism. The coil may include a first coil portion and a second coil portion. The first coil portion may be configured to cover the second coil portion. The second coil portion may be located on and moveable with respect to the support component. The lock mechanism may be located on the second coil portion. The lock mechanism may be configured to lock or unlock the second coil portion and the support component. The lock mechanism may be controlled by locking or unlocking the first coil portion and the second coil portion. It should be noted that the coil assembly described above may be the same as or similar to other coil assemblies (e.g., the coil assembly in FIG. 1, the coil assembly 300, 400, 500, 600, 900, 1200, 1400, 1500, 1800, or 2000) described elsewhere in the present disclosure, the descriptions of which may be not repeated.

In some embodiments, the lock mechanism may include a pressing component, a transmission component, and a lock component. The pressing component may extend beyond the second coil portion such that the pressing component abuts (or comes into contact with) the first coil portion when the first coil portion and the second coil portion are locked. The transmission component may be connected to the pressing component and the lock component. The lock component may be configured to lock the second coil portion and the support component.

In some embodiments, the transmission component may include a string and at least one pully. The at least one pully may be rotatably located on the second coil portion. A first end of the string may be connected to the pressing component. A second end of the string may be wound around the at least one pully and connected to the lock component. The pressing component may cause the lock component to move via the string.

In some embodiments, the lock mechanism may also include a reset component. The reset component may be located on the second coil portion and configured to reset the pressing component.

In some embodiments, the transmission component may include a rod, a first rotation component and a second rotation component. A first end of the rod may be connected to the pressing component via the first rotation component. A second end of the rod may be connected to the lock component via the second rotation component. The pressing component may cause the lock component to move via the rod.

In some embodiments, the transmission component may include a gear, a first rack, and a second rack. The first rack may be connected to the pressing component and the gear. The second rack may be connected to the lock component and the gear. The pressing component may cause the lock component to move via the gear, the first rack, and the second rack.

In some embodiments, the lock component may include a lock pin, an elastic unit, and a positioning unit. The lock pin may be located on the second coil portion. The lock pin may be movably located on the positioning unit. The elastic unit may be elastically connected to the positioning component and the lock pin.

In some embodiments, the lock mechanism may include a switch, a first connector, and a second connector. The first connector may be located on the first coil portion. The second connector may be located on the second coil portion. The switch may be electrically connected to the second connector. The switch may be configured to lock or unlock the second coil portion and the support component.

In some embodiments of the present disclosure, a method for controlling a coil assembly may be provided. The coil assembly may include a support component, a coil, and a lock mechanism. The coil may include a first coil portion and a second coil portion. The first coil portion may match the second coil portion. The first coil portion may be configured to lock with the second coil portion. The second coil portion may be detachably located on the support component. The second coil portion may be configured to fix at a plurality of positions with respect to the support component. In some embodiments, the lock mechanism may be located on the second coil portion. In some embodiments, the lock mechanism may be partially located on the second coil portion and partially on the first coil portion. The lock mechanism may be configured to lock the second coil portion and the support component. The second coil portion may be caused to move along a length direction of the support component when the first coil portion and the second coil portion are in an unlocked state. The first coil portion may be caused to lock with the second coil portion. In response to the locking of the first coil portion and the second coil portion, the second coil portion and the support component may be locked at a predetermined position (e.g., the target position in FIG. 3) via the lock mechanism.

In some embodiments, the lock mechanism may be a mechanical trigger. When the first coil portion and the second coil portion are in an unlocked state, a portion (also referred to as a first portion) of the lock mechanism may extend to the outside of the second coil portion. For example, the first portion of the lock mechanism may extend beyond an upper surface of the second coil portion that abuts the first coil portion when the first coil portion and the second coil portion are locked. A remaining portion of the lock mechanism may be located inside the second coil portion.

In some embodiments, when the first coil portion is locked with the second coil portion, the first coil portion may abut the first portion of the lock mechanism that extends beyond the upper surface of the second coil portion. The first coil portion of a weight may press the lock mechanism, such that the lock mechanism may move relative to the second coil portion. At least a portion (also referred to as a second portion) of the remaining portion of the lock mechanism may move to the outside of the second coil portion. For example, the second portion of the lock mechanism may extend from the bottom of the second coil portion to the outside of the second coil portion and abut the support component to lock the coil assembly and the support component.

In some embodiments, in response to the locking of the first coil portion and the second coil portion, the first coil portion and the second coil portion may establish an electrical connection. In some embodiments, the first coil portion may include a first connector. The second coil portion may include a second connector. The coil assembly may also include a switch connected to the first connector and/or the second connector. The lock mechanism may include an electrical trigger. When the first coil portion and the second coil portion are in an unlocked state, the first connector and the second connector may be not electrically connected. The switch may be in a non-operating state. When the first coil portion is locked with the second coil portion, the first connector and the second connector may be electrically connected. The switch may be in an operating state, and cause the second coil portion and the support component in a locked state.

In some embodiments, the second coil portion may include a sensor. The sensor may be located on a surface (e.g., the upper surface) of the second coil portion that abuts the first coil portion when the first coil portion and the second coil portion are locked. The lock mechanism may include a sensor trigger. When the first coil portion and the second coil portion are unlocked, the sensor may fail to detect a pressure signal. The switch may be in the non-operating state. When the first coil portion is locked with the second coil portion, the sensor may detect the pressure signal. The switch may receive the pressure signal and switch from the non-operating state to the operating state. The second coil portion may be locked with the support component. It should be noted that the coil assembly described above may be the same as or similar to other coil assemblies (e.g., the coil assembly in FIG. 1, the coil assembly 300, 400, 500, 600, 900, 1200, 1400, 1500, or 2000) described elsewhere in the present disclosure, the descriptions of which may be not repeated.

In some embodiments of the present disclosure, a coil assembly may be provided. The coil assembly may include a support component, a coil, and a lock mechanism. The coil may include a first coil portion and a second coil portion. The second coil portion may be located on and moveable with respect to the support component. The lock mechanism may include a pressing component and a lock component. The pressing component may extend beyond the second coil portion. The pressing component may be connected to the lock component. The pressing component may be moveable with respect to the second coil portion under an external force to cause at least a portion of the lock component to extend out of the second coil portion and abut the support component. It should be noted that the coil assembly described above may be the same as or similar to other coil assemblies (e.g., the coil assembly in FIG. 1, the coil assembly 300, 400, 500, 600, 900, 1200, 1400, 1500, or 2000) described elsewhere in the present disclosure, the descriptions of which may be not repeated.

In some embodiments, the lock mechanism may also include a guiding mechanism. The guiding mechanism may be connected to the pressing component and the lock component.

In some embodiments, the first coil portion may be detachably connected to the second coil portion. When the first coil portion is locked with the second coil portion, the first coil portion may abut the pressing component. The pressing component may cause the lock component to lock the second coil portion and the support component via the transmission component.

In some embodiments, the transmission component may include a string and at least one pully. The at least one pully may be rotatably located on the second coil portion. A first end of the string may be connected to the pressing component. A second end of the string may be wound around the at least one pully and connected to the lock component. The pressing component may cause the lock component to move via the string.

In some embodiments, the lock mechanism may also include a reset component. The reset component may include a positioning unit and an elastic unit. The positioning unit may be located on the second coil portion. The pressing component may be movably located on the positioning unit. The elastic unit may be elastically connected to the positioning unit and the pressing component.

In some embodiments, the transmission component may include a rod, a first rotation component and a second rotation component. A first end of the rod may be connected to the pressing component via the first rotation component. A second end of the rod may be connected to the lock component via the second rotation component. The pressing component may cause the lock component to move via the rod.

In some embodiments, the transmission component may include a gear, a first rack, and a second rack. The first rack may be connected to the pressing component and the gear. The second rack may be connected to the lock component and the gear. The pressing component may cause the lock component to move via the gear, the first rack, and the second rack.

In some embodiments, the lock component may include a lock pin, an elastic unit, and a positioning unit. The lock pin may be connected to the transmission component. The positioning unit may be located on the second coil portion. The lock pin may be movably located on the positioning unit. The elastic unit may be elastically connected to the positioning component and the lock pin.

In some embodiments, the lock mechanism may include a guiding mechanism. The guiding mechanism may include a guiding component. The support component may include a slot. A first end of the guiding component may be fixed on the second coil portion. A second end of the guiding component may be inserted into the slot and slidable along the slot.

In some embodiments of the present disclosure, an MRI system may be provided. The MRI system may include an imaging device, a table, and a coil assembly. The imaging device may have a magnetic hole. The coil assembly may include a support component, a coil, and a lock mechanism. The coil may include a first coil portion and a second coil portion. The first coil portion may be detachably connected to the second coil portion. The second coil portion may be located on and movable with respect to the support component. In some embodiments, the lock mechanism may include a pressing component and a lock component. The pressing component may extend beyond the second coil portion. The pressing component may be connected to the lock component. The first coil portion may abut the pressing component when the first coil portion and the second coil portion are locked. The pressing component may be moveable with respect to the second coil portion to cause at least a portion of the lock component to extend out of the second coil portion and abut the support component.

In some embodiments, the coil assembly may be mounted on the table. The table may cause the coil assembly in or out of the magnetic hole of the imaging device. After the MRI system utilizes the coil assembly, a position of the coil assembly may be adjustable, facilitating an alignment of the coil assembly to a region of a subject to be examined. A structure of the lock mechanism on the coil assembly may be simplified. The locking or unlocking may be easily performed. It should be noted that the coil assembly described above may be the same as or similar to other coil assemblies (e.g., the coil assembly in FIG. 1, the coil assembly 300, 400, 500, 600, 900, 1200, 1400, 1500, 1800, or 2000) described elsewhere in the present disclosure, the descriptions of which may be not repeated.

As described above, a lock mechanism of a coil assembly (e.g., the coil assembly in FIG. 1, the coil assembly 300, 400, 500, 600, 900, 1200, 1400, 1500, 1800, or 2000) may contact with a bottom surface of a first coil portion of the coil assembly. An upper side of the lock mechanism may protrude beyond an upper surface of a second coil portion of the coil assembly and abut the bottom surface of the first coil portion to trigger a locking function. It should be noted that the above descriptions are for illustration purposes. In some embodiments, the lock mechanism of the coil assembly may contact with an arbitrary region of the first coil portion to perform the locking function.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/ or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A coil assembly, comprising:
   a support component;
   a coil comprising a first portion and a second portion, the first portion of the coil being configured to cover the second portion of the coil, and the second portion of the coil being located on and moveable with respect to the support component; and
   a lock mechanism located on the second portion of the coil, the lock mechanism being configured to lock or unlock the second portion of the coil and the support component,
   the lock mechanism being controlled by locking or unlocking the first portion and the second portion of the coil.

2. A coil assembly configured to transmit or receive a magnetic resonance (MR) signal, comprising:
   a coil including a first portion and a second portion detachably connected to the first portion;
   a support component configured to support the coil, the second portion of the coil being movable with respect to the support component; and
   a lock mechanism configured to lock or unlock the second portion of the coil and the support component, wherein
   the second portion of the coil is locked, via the lock mechanism, with the support component when the first portion and the second portion of the coil are in a locked state; and
   the second portion of the coil is unlocked, via the lock mechanism, from the support component when the first portion and the second portion of the coil are in an unlocked state.

3. The coil assembly of claim 2, wherein
   the lock mechanism is located on the second portion of the coil; or
   the lock mechanism is partially located on the first portion and partially on the second portion of the coil.

4. The coil assembly of claim 2, wherein
   a locking of the first portion and the second portion of the coil causes a portion of the lock mechanism to move to abut the support component such that the second portion of the coil and the support component are locked; and
   an unlocking of the first portion and the second portion of the coil causes the portion of the lock mechanism to move away from the support component such that the second portion of the coil and the support component are unlocked.

5. The coil assembly of claim 4, wherein
   a first surface of the first portion of the coil abuts a second surface of the second portion of the coil when the first portion and the second portion of the coil are locked; and
   a portion of the lock mechanism protrudes beyond the second surface of the second portion of the coil such that the portion of the lock mechanism moves relative to the second portion of the coil in response to the locking of the first portion and the second portion of the coil.

6. The coil assembly of claim 2, the lock mechanism comprising at least one of a pressing component, a transmission component, or a lock component, wherein
   the pressing component is connected to the lock component via the transmission component;
   the pressing component is configured to move with respect to the second portion of the coil in response to a locking or an unlocking of the first portion and the second portion of the coil; and
   the lock component is configured to move to lock or unlock, via the transmission component, the second portion of the coil and the support component in response to the movement of the pressing component.

7. The coil assembly of claim 6, wherein
   a first surface of the first portion of the coil abuts a second surface of the second portion of the coil when the first portion and the second portion of the coil are locked; and
   at least a portion of the pressing component protrudes beyond the second surface of the second portion of the coil such that the pressing component moves relative to the second portion of the coil in response to the locking of the first portion and the second portion of the coil.

8. The coil assembly of claim 7, wherein the pressing component is located on the second portion of the coil symmetrically with respect to the second surface of the second portion of the coil.

9. The coil assembly of claim 7, wherein the transmission component is located on the second portion of the coil symmetrically with respect to a third surface of the second portion of the coil different from the second portion of the coil.

10. The coil assembly of claim 6, the transmission component comprising at least one pully and a string wrapped around the at least one pully, wherein
    a first end of the string is connected to the pressing component;
    a second end of the string is connected to the lock component; and
    the lock component is configured to move with the pressing component via the string and the at least one pully.

11. The coil assembly of claim 6, the transmission component comprising a first rotation component, a second rotation component, and a rod connecting the first rotation component and the second rotation component, wherein
    a first end of the rod is connected to the pressing component via the first rotation component;
    a second end of the rod is connected to the lock component via the second rotation component; and
    the lock component is configured to move with the pressing component via the rod, the first rotation component, and the second rotation component.

12. The coil assembly of claim 6, the transmission component comprising a first rack, a second rack, and a gear meshing with the first rack and the second rack, wherein
the first rack is connected to the pressing component and the gear;
the second rack is connected to the lock component and the gear; and
the lock component is configured to move with the pressing component via the gear, the first rack, and the second rack.

13. The coil assembly of claim 6, the lock component comprising a lock pin, an elastic unit, and a positioning unit, wherein
the lock pin is connected to the transmission component and is connected, via the elastic unit, to the positioning unit;
in response to the locking of the first portion and the second portion of the coil, the lock pin is configured to move to abut the support component to lock the second portion of the coil and the support component;
in response to the unlocking of the first portion and the second portion of the coil, the lock pin is configured to move away from the support component to unlock the second portion of the coil and the support component; and
the positioning unit is configured to limit a movement of the elastic unit.

14. The coil assembly of claim 6, the lock mechanism comprising a reset component located on the second portion of the coil and configured to reset a position of the pressing component, wherein the reset component includes
a positioning unit configured to support the pressing component; and
an elastic unit configured to retractably move with respect to the positioning unit, wherein
in response to the locking of the first portion and the second portion of the coil, the pressing component compresses the elastic unit such that the pressing component moves along a first direction to cause the locking of the second portion of the coil and the support component; and
in response to the unlocking of the first portion and the second portion of the coil, the pressing component moves along a second direction that is opposite to the first direction to cause the unlocking of the second portion of the coil and the support component.

15. The coil assembly of claim 2, further comprising a guiding mechanism configured to guide the second portion of the coil to move along a predetermined direction with respect to the support component, wherein the guiding mechanism includes
a slot located on the support component; and
a guiding component, wherein
a first end of the guiding component is fixed on the second portion of the coil;
a second end of the guiding component extends into the slot; and
the guiding component moves along the slot.

16. The coil assembly of claim 6, further comprising an optical trigger, wherein the optical trigger is configured to cause the lock mechanism to lock the second portion of the coil and the support component in response to the locking of the first portion and the second portion of the coil; and
the optical trigger is configured to cause the lock mechanism to unlock the second portion of the coil and the support component in response to the unlocking of the first portion and the second portion of the coil.

17. The coil assembly of claim 16, the optical trigger comprising a switch, a first connector, and a second connector, wherein
the first connector is located on the first portion of the coil;
the second connector is located on the second portion of the coil;
the switch is connected to the second connector; and
in response to the locking of the first portion and the second portion of the coil, the first connector and the second connector are electrically connected such that the switch causes the lock mechanism to lock the second portion of the coil and the support component.

18. The coil assembly of claim 6, further comprising an electrical trigger, wherein
the electrical trigger is configured to cause the lock mechanism to lock the second portion of the coil and the support component in response to the locking of the first portion and the second portion of the coil; or
the electrical trigger is configured to cause the lock mechanism to unlock the second portion of the coil and the support component in response to the unlocking of the first portion and the second portion of the coil.

19. A magnetic resonance imaging system, comprising:
an imaging device having a magnetic hole;
a table; and
a coil assembly comprising:
a support component;
a coil comprising a first portion and a second portion, the first portion of the coil being detachably connected to the second portion of the coil and the second portion of the coil being located on and movable with respect to the support component; and
a lock mechanism comprising a pressing component and a lock component, wherein
the pressing component extends beyond the second portion of the coil;
the pressing component is connected to the lock component;
the first portion of the coil abuts the pressing component when the first portion and the second portion of the coil are locked; and
the pressing component is moveable with respect to the second portion of the coil to cause at least a portion of the lock component to extend out of the second portion of the coil and abut the support component; or
the lock mechanism includes a switch, the switch being controlled, via a sensor trigger or an electrical trigger, to lock the second portion of the coil and the support component after the first portion and the second portion of the coil are locked.

* * * * *